(12) United States Patent
Kanno

(10) Patent No.: US 11,023,371 B2
(45) Date of Patent: *Jun. 1, 2021

(54) MEMORY SYSTEM AND METHOD FOR CONTROLLING NONVOLATILE MEMORY

(71) Applicant: Toshiba Memory Corporation, Tokyo (JP)

(72) Inventor: Shinichi Kanno, Tokyo (JP)

(73) Assignee: Toshiba Memory Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/816,888

(22) Filed: Mar. 12, 2020

(65) Prior Publication Data

US 2020/0218648 A1 Jul. 9, 2020

Related U.S. Application Data

(63) Continuation of application No. 16/017,055, filed on Jun. 25, 2018, now Pat. No. 10,592,409.

(30) Foreign Application Priority Data

Oct. 30, 2017 (JP) .............................. JP2017-209317

(51) Int. Cl.
*G06F 12/02* (2006.01)
*G06F 3/06* (2006.01)
*G11C 29/42* (2006.01)
*G11C 29/00* (2006.01)
*G11C 29/02* (2006.01)
(Continued)

(52) U.S. Cl.
CPC .......... *G06F 12/0246* (2013.01); *G06F 3/064* (2013.01); *G06F 3/0604* (2013.01);
(Continued)

(58) Field of Classification Search
CPC ...... G06F 3/0604; G06F 3/064; G06F 3/0659; G06F 3/0679; G06F 12/0246;
(Continued)

(56) References Cited

U.S. PATENT DOCUMENTS 8,397,019 B2   3/2013 Estakhri et al.
9,569,308 B1 * 2/2017 Ware ................. H03M 13/6502
(Continued)

FOREIGN PATENT DOCUMENTS

JP   2017-162065 A   9/2017

OTHER PUBLICATIONS

Yiying Zhang et al., "De-indirection for Flash-based SSDs with Nameless Writes," 10th USENIX Conference on File and Storage Technologies (FAST '12), Feb. 14-17, 2012, pp. 1-16.

*Primary Examiner* — Gary J Portka
(74) *Attorney, Agent, or Firm* — White & Case LLP

(57) ABSTRACT

According to one embodiment, a memory system manages a plurality of parallel units each including blocks belonging to different nonvolatile memory dies. When receiving from a host a write request designating a third address to identify first data to be written, the memory system selects one block from undefective blocks included in one parallel unit as a write destination block by referring to defect information, determines a write destination location in the selected block, and writes the first data to the write destination location. The memory system notifies the host of a first physical address indicative of both of the selected block and the write destination location, and the third address.

16 Claims, 40 Drawing Sheets

(51) Int. Cl.
  *G11C 29/52* (2006.01)
  *G11C 16/08* (2006.01)
  *G11C 29/44* (2006.01)
  *G11C 29/18* (2006.01)

(52) U.S. Cl.
  CPC .......... *G06F 3/0659* (2013.01); *G06F 3/0679* (2013.01); *G06F 12/0292* (2013.01); *G11C 29/028* (2013.01); *G11C 29/42* (2013.01); *G11C 29/52* (2013.01); *G11C 29/72* (2013.01); *G11C 29/765* (2013.01); *G11C 16/08* (2013.01); *G11C 2029/1806* (2013.01); *G11C 2029/4402* (2013.01)

(58) Field of Classification Search
  CPC ......... G06F 12/0292; G06F 2212/7201; G06F 2212/7208; G11C 16/108; G11C 29/42; G11C 29/765
  USPC .............................................. 711/5, 103, 201
  See application file for complete search history.

(56) References Cited

U.S. PATENT DOCUMENTS

| | | |
|---|---|---|
| 9,582,431 B2 | 2/2017 | Cohen |
| 2011/0072199 A1 | 3/2011 | Reiter et al. |
| 2014/0189203 A1 | 7/2014 | Suzuki et al. |
| 2015/0339223 A1 | 11/2015 | Matsudaira et al. |
| 2016/0313921 A1 | 10/2016 | Kojima |
| 2017/0046073 A1 | 2/2017 | Guo et al. |
| 2017/0139616 A1 | 5/2017 | Dubeyko et al. |
| 2017/0262175 A1 | 9/2017 | Kanno |
| 2019/0129850 A1 | 5/2019 | Chang et al. |

* cited by examiner

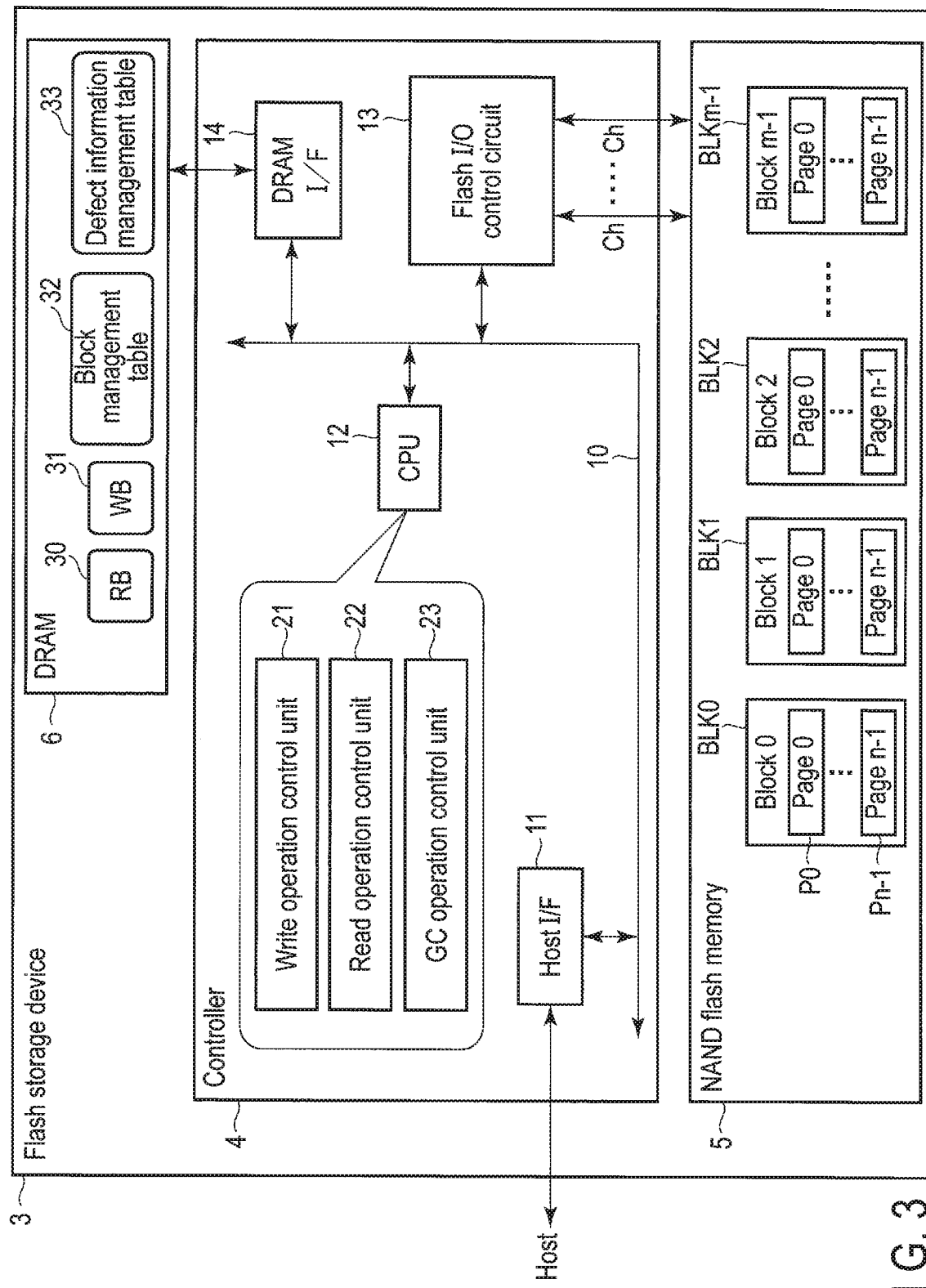
F I G. 3

Commands for In-Drive-GC API

Write without Physical Address
 Host: user-address, length, data, QoS-domain-identifier
 Device: status, user-address(es), flash-address(es), length(s), (distance-to-block-boundary)

Read with Physical Address
 Host: flash-address(es), length(s)
 Device: status, user-address(es), length, data

Trim/Duplicate
 Host: flash-address(es), length(s), reference-count(s)-to-add-or-subtract
 Device: status

Address Update Notification (Device Initiated)
 Host: none
 Device: user-address(es), old-flash-address(es), new-flash-address(es), reference-count(s), length(s)

Forced Garbage-Collection
 Host: QoS-domain-identifier, (source-super-block-address)
 Device: status

Garbage Collection Control
 Host: maximum-number-of-data, QoS-domain-identifier, method-of-GC(stable latency, idle time, stop)
 Device: status

FIG. 4

Commands for Super Block API

Write without Page Address
    Host: user-address, length, data, super-block-address
    Device: status, user-address(es), flash-address(es), length(s), distance-to-block-boundary

Read with Physical Address
    Host: flash-address(es), length(s)
    Device: status, user-address(es), length, data

Release Super Block to Unused Super Block Pool
    Host: super-block-address
    Device: status

Allocate Super Block and Open Write Buffer with Block Healing
    Host: QoS-domain-identifier, required-retention-term
    Device: status, super-block-address, super-block-size, erase-count, serial-number-of-super-block

Close Super Block and Write Buffer
    Host: super-block-address
    Device: status

Super Block Information
    Host: super-block-address
    Device: status, QoS-domain-identifier, super-block-address, erase-count, serial-number-of-super-block, list-of-user-addresses, (list-of-reference-counts), super-block-size

Set Data not to be Copied
    Host: super-block-address, bitmap-of-data-not-to-be-copied
    Device: status

Data Copy without Page Address
    Host: source-flash-address, destination-super-block-address, number-of-data-to-be-copied
    Device: status, user-address(es), source-flash-address(es), destination-flash-address(es), distance-to-destination-block-boundary

FIG. 5

Defect information management table for SB5
33

| Die | Block | Defect |
|---|---|---|
| Die #0 | P0 P1 BLK 5 ○ | 0 |
| Die #1 | P0 P1 BLK 5 × | 1 |
| Die #2 | P0 P1 BLK 5 ○ | 0 |
| Die #3 | P0 P1 BLK 5 ○ | 0 |
| Die #4 | P0 P1 BLK 5 × | 1 |
| Die #5 | P0 P1 BLK 5 × | 1 |
| Die #6 | P0 P1 BLK 5 ○ | 0 |
| Die #7 | P0 P1 BLK 5 ○ | 0 |

Super block SB5

F I G. 10

Write command (Write without Physical Address)

|  | Description |
|---|---|
| Command ID | Command ID for write command |
| QoS domain ID | Identifier to uniquely identify QoS domain to which data should be written |
| User address | User address is tag for identifying data (e.g., LBA, Key, and File identifier) |
| Length | Length of data which should be written |

F I G. 11

Response to write command

|  | Description |
|---|---|
| User address | User address included in write command |
| Flash address | Flash address is indicative of physical address of physical storage location to which data is written |
| Length | Length of written data |
| Amount of remaining writable data (distance-to-block-boundary) |  |

F I G. 12

Trim command

|  | Description |
|---|---|
| Command ID | Command ID for Trim command |
| Flash address | Flash address is indicative of first physical storage location in which data to be invalidated (data having reference count to be decremented) is stored |
| Length | Length of data which should be invalidated (data length can be designated by number of grains) |
| Decrement of reference count |  |

F I G. 13

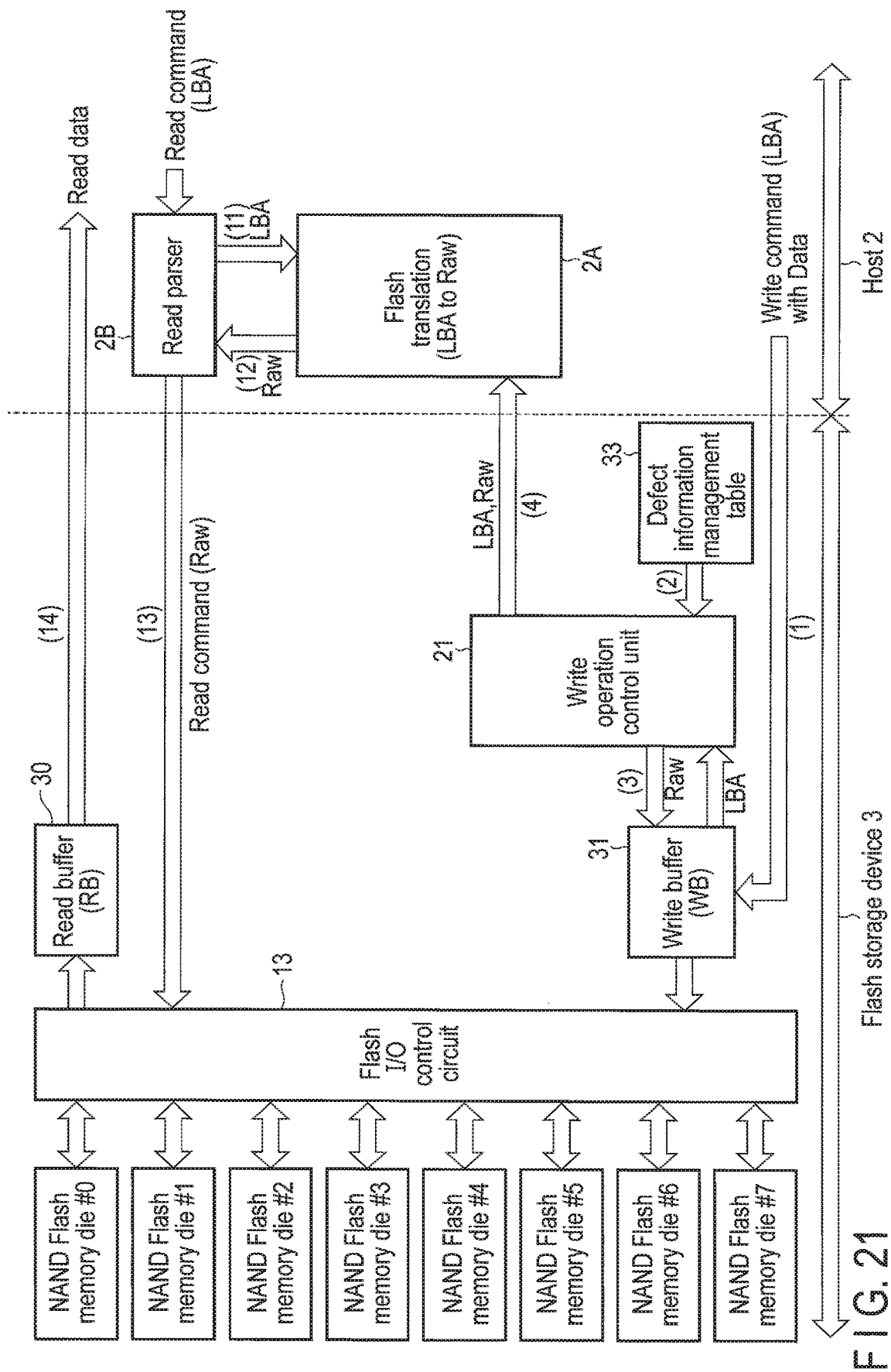
F I G. 21

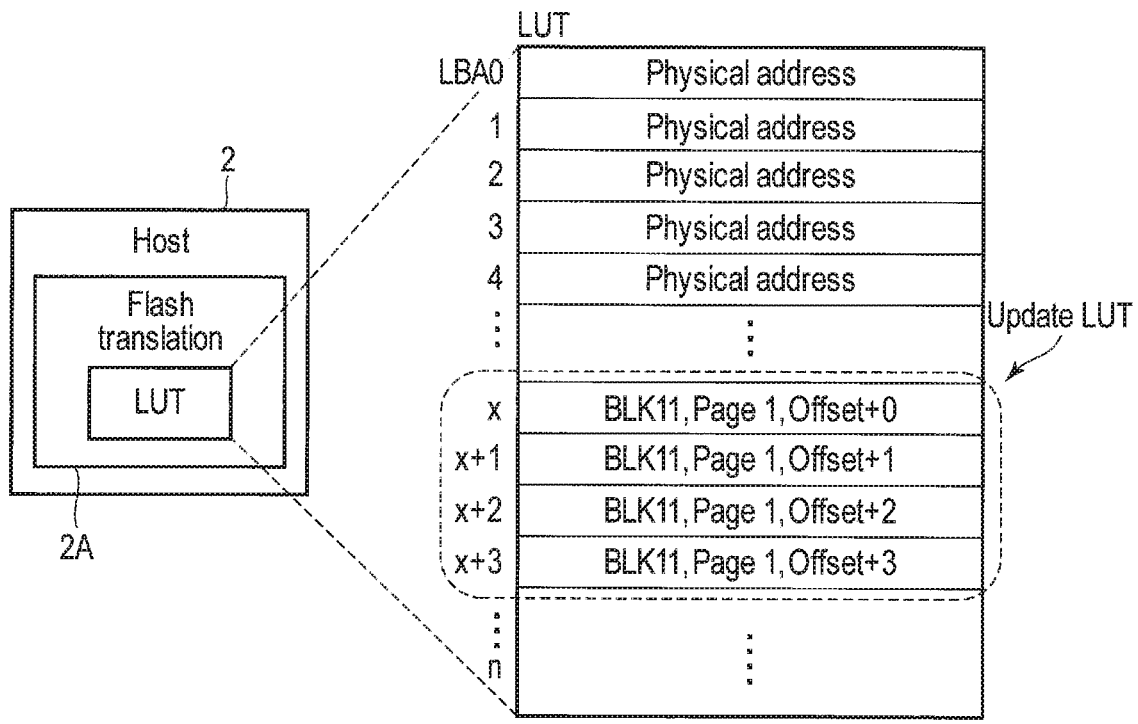
F I G. 25
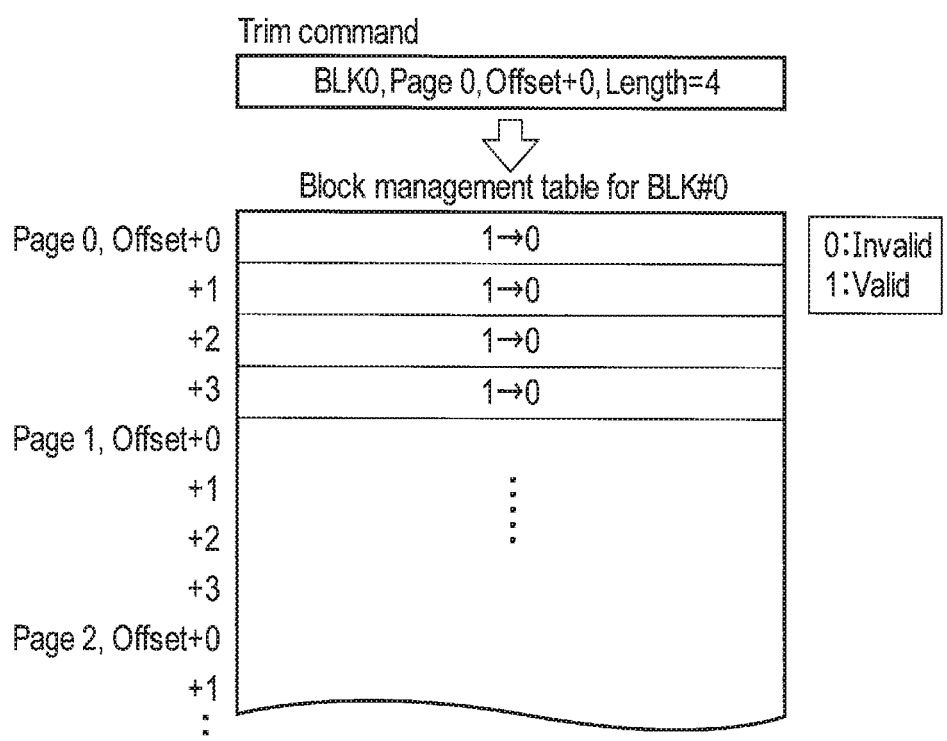
F I G. 26

Read command (Read with Physical Address)

| | Description |
|---|---|
| Command ID | Command ID for read command |
| Flash address | Physical address is indicative of first physical location from which data should be read |
| Length | Length of data which should be read |
| Flash address | Physical address is indicative of first physical location from which data should be read |
| Length | Length of data which should be read |
| Transfer destination pointer | Location in host memory to which read data should be transferred |

F I G. 27

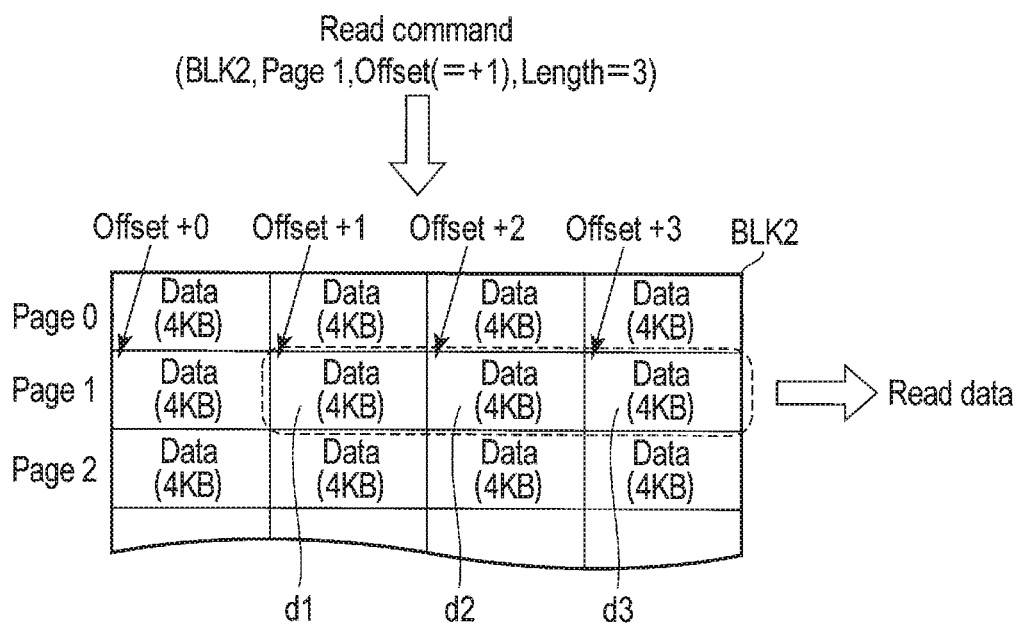

F I G. 28

GC control command (Garbage Collection Control)

|  | Description |
| --- | --- |
| Command ID | Command ID for GC control |
| Policy | Host can designate policy to select GC candidate block. Device supports plural policies, and selects GC candidate block by using policy designated by host |
| QoS domain ID | Host can designate QoS domain which should be subjected to GC |
| Maximum number of data |  |

Forced GC command (Forced Garbage Control)

| | Description |
|---|---|
| Command ID | Command ID for forced GC |
| QoS domain ID | Host can designate QoS domain which should be subjected to GC |
| Super block address (optional) | |

F I G. 31

Address update notification (Address Update Notification (Device Initiated))

| | Description |
|---|---|
| User address | Address of copied data |
| Previous flash address | Previous physical address of copied data |
| New flash address | New physical address of copied data |
| Reference count | Number of user addresses referring to copied data |
| Length | Length of copied data |

F I G. 32

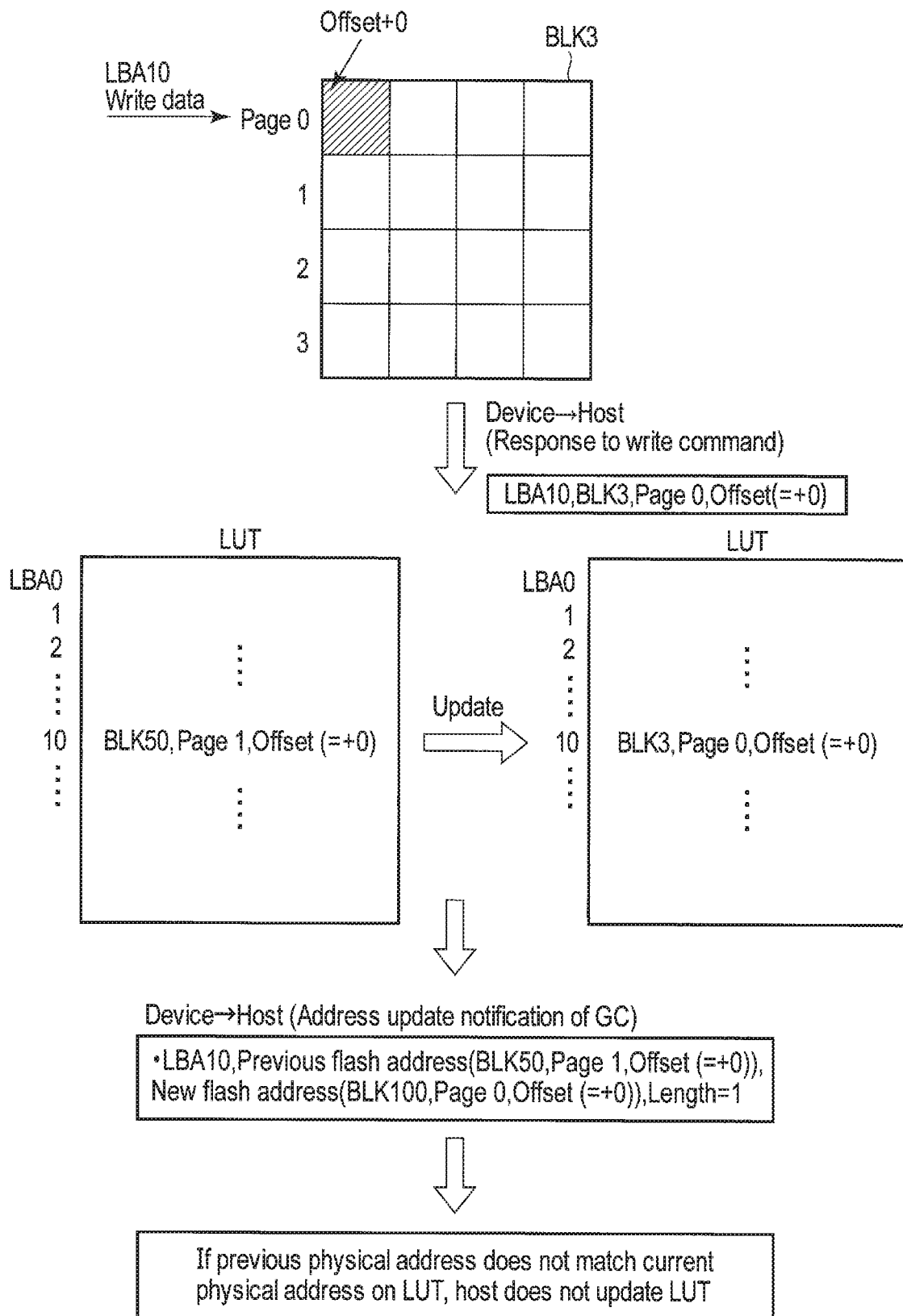
F I G. 36

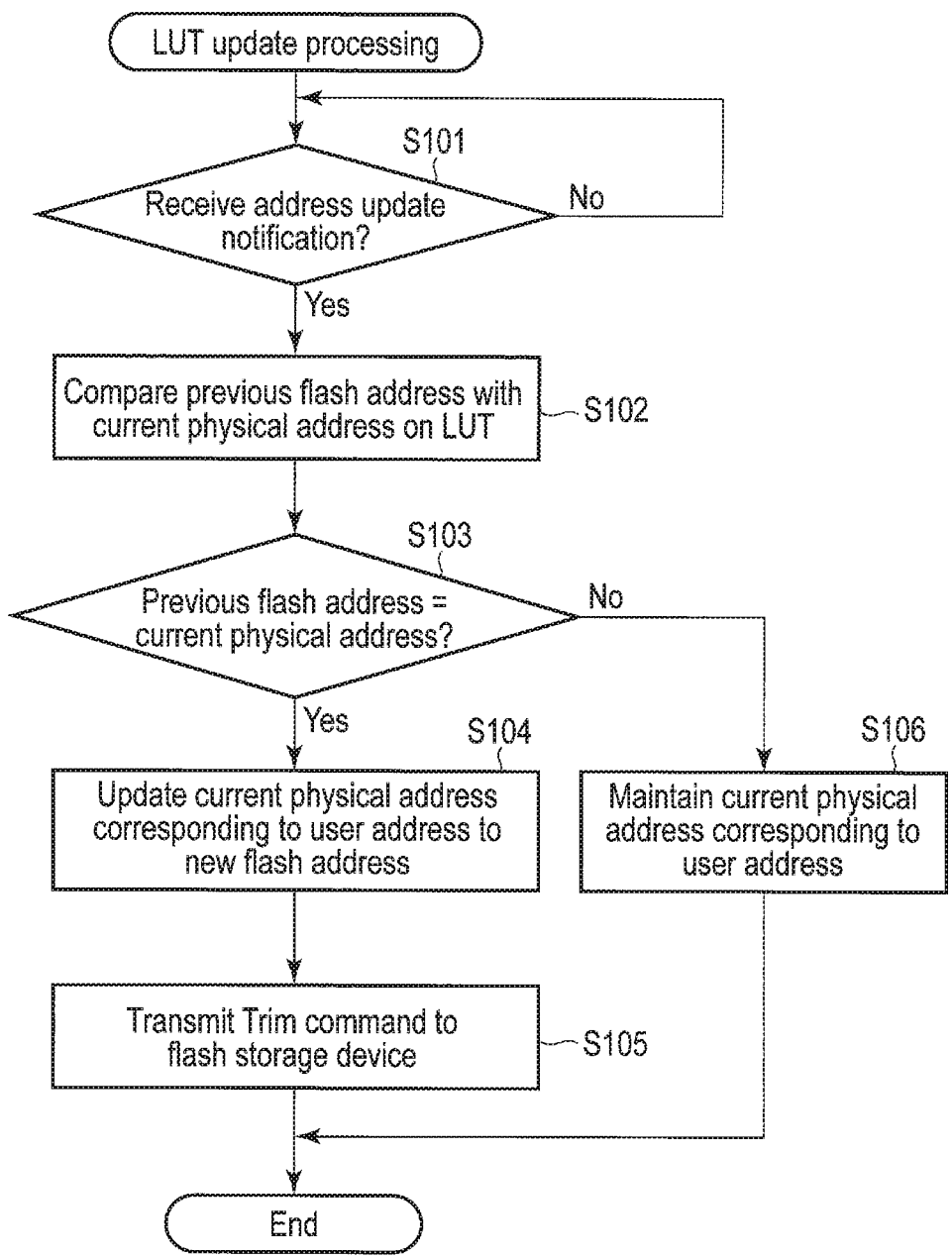
F I G. 37

Block management table for BLK#1

| Page 0, Offset+0 | 1 (Reference count) |
|---|---|
| +1 | 4 |
| +2 | 2 |
| +3 | 3 |
| Page 1, Offset+0 | 5 |
| +1 | 6 |
| +2 | 0 |
| ⋮ | ⋮ |

Invalid: Reference count=0
Valid: Reference count≥1

FIG. 38

Duplicate command

|  | Description |
|---|---|
| Command ID | Command ID for duplicate command |
| Flash address | Flash address is indicative of first physical location storing data in which reference count should be incremented by 1 |
| Length | Length of data in which reference count should be incremented by 1 |

FIG. 39

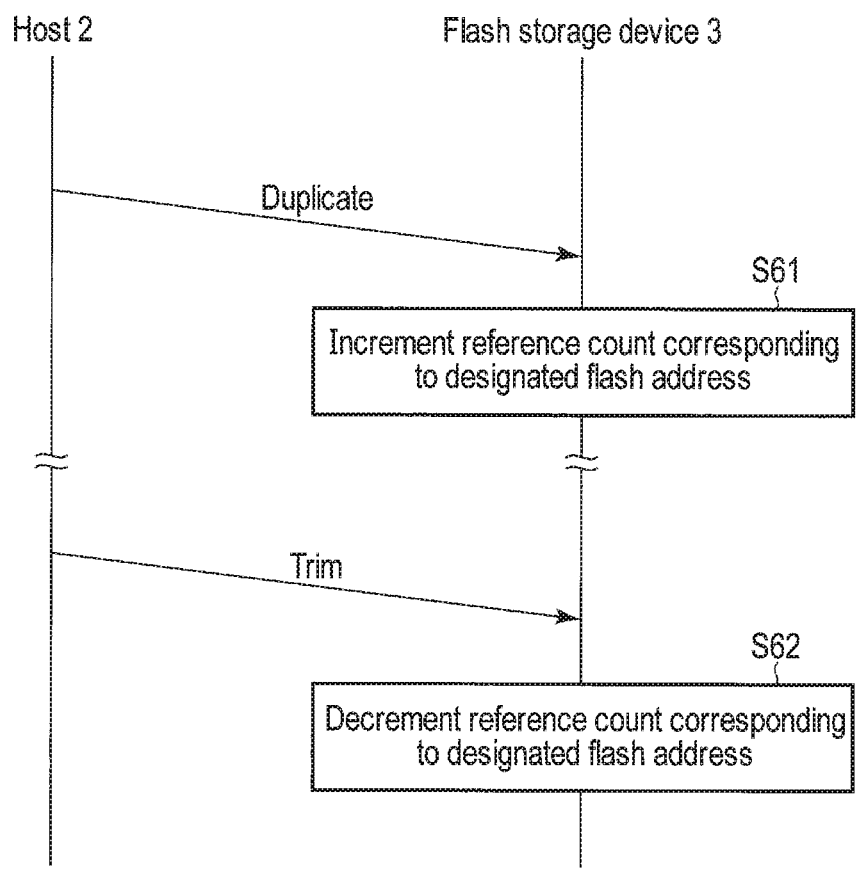
F I G. 40

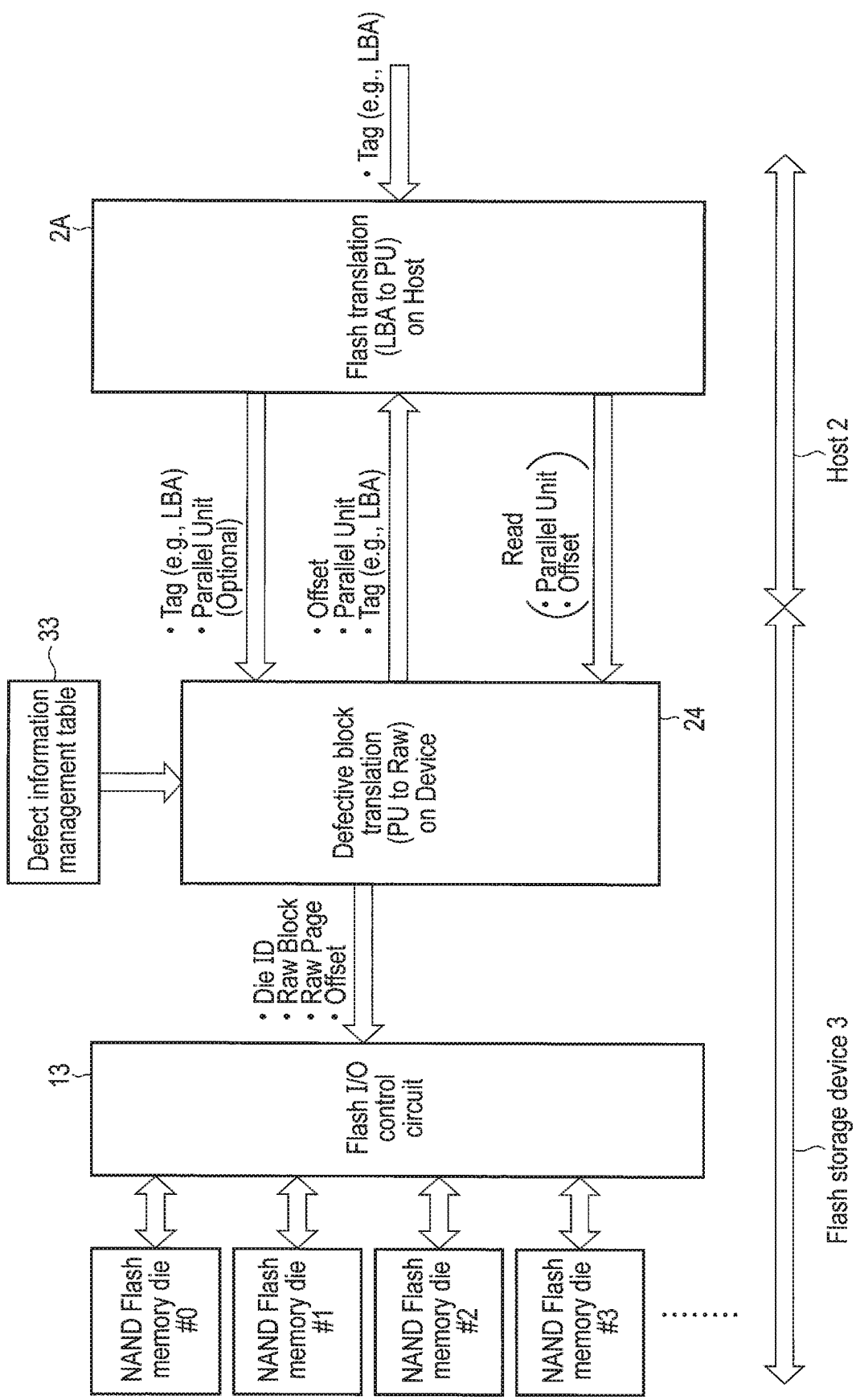
F I G. 44

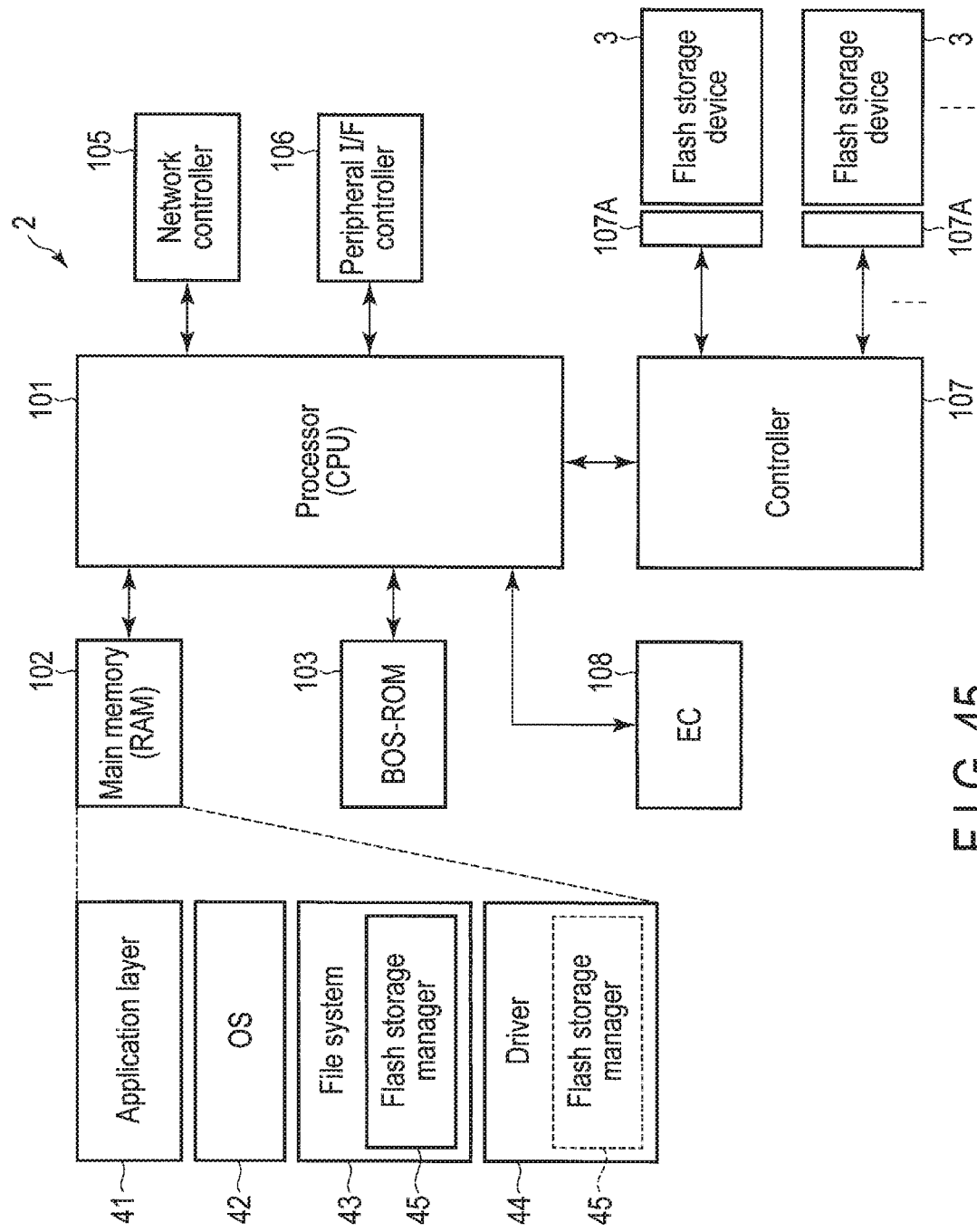
F I G. 45

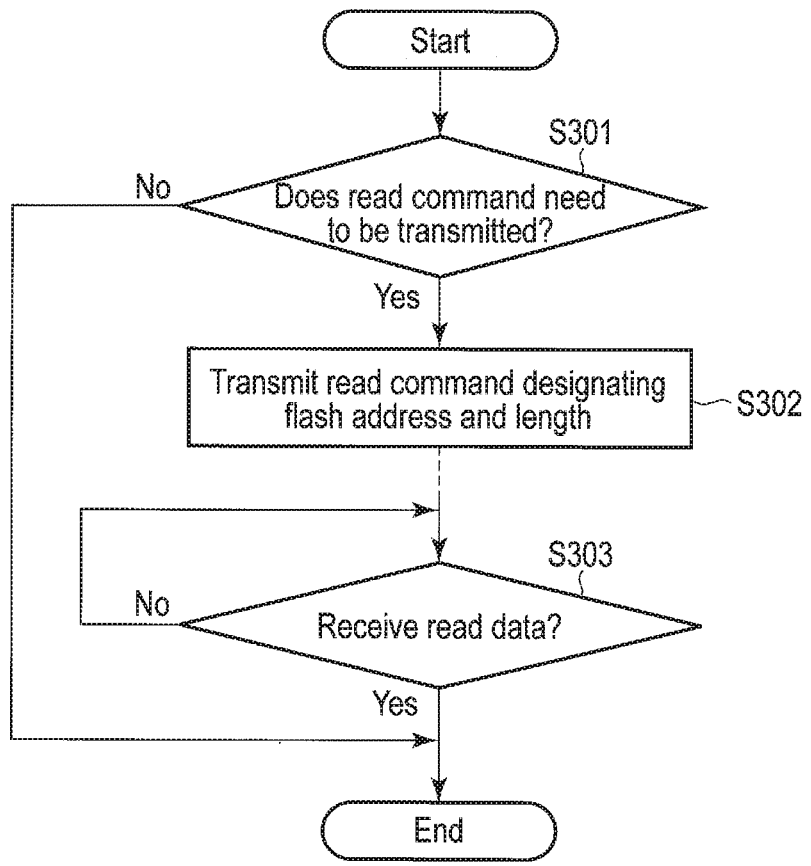
F I G. 48

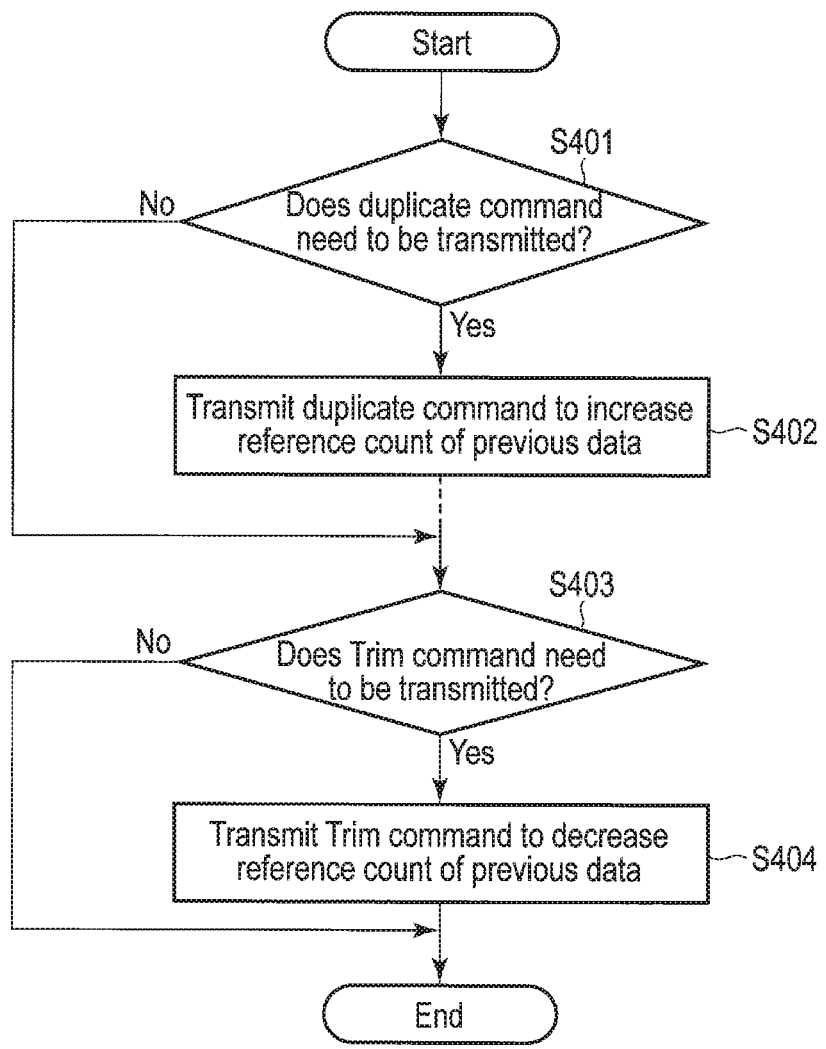
F I G. 49

MEMORY SYSTEM AND METHOD FOR CONTROLLING NONVOLATILE MEMORY

CROSS-REFERENCE TO RELATED APPLICATIONS

This application is continuation of application Ser. No. 16/017,055 filed Jun. 25, 2018 and is based upon and claims the benefit of priority from Japanese Patent Application No. 2017-209317, filed Oct. 30, 2017, the entire contents of which are incorporated herein by reference.

FIELD

Embodiments described herein relate generally to a technology of controlling a nonvolatile memory.

BACKGROUND

In recent years, memory systems comprising nonvolatile memories have been widely prevalent. As such a memory system, a solid state drive (SSD) based on a NAND flash technology is known.

SSD is also used as the storage in a server of the data center.

The storage used in a host computing system such as a server is required to exert high-level I/O performance.

For this reason, a new interface between a host and a storage has been recently proposed.

However, if the number of defective blocks included in the nonvolatile memory is increased, increase in the amount of replacement information to replace the defective blocks with the other blocks and increase in the read latency time due to a processing for this replacement may occur.

Accordingly, implement of a new technology of reducing an influence which results from increase in the defective blocks has been required.

BRIEF DESCRIPTION OF THE DRAWINGS

FIG. 3 is a block diagram showing a configuration example of the flash storage device.

FIG. 4 is a table showing commands for In-Drive-GC API.

FIG. 5 is a table showing commands for super block API.

FIG. 10 is a diagram for explanation of an operation of selecting a write destination block from undefective blocks in the super block without replacing the defective blocks.

FIG. 11 is a table for explanation of a write command applied to the flash storage device.

FIG. 12 is a table for explanation of a response to the write command shown in FIG. 11.

FIG. 13 is a table for explanation of a Trim command applied to the flash storage device.

FIG. 21 is a block diagram for explanation of a write operation and a read operation executed by the host and the flash storage device.

FIG. 25 is a diagram for explanation of an operation of updating a lookup table (logical-to-physical address translation table) managed by the host.

FIG. 26 is a diagram for explanation of an operation of updating the block management table in response to a notification from the host indicative of a physical address corresponding to data which should be invalidated.

FIG. 27 is a table for explanation of the read command applied to the flash storage device.

FIG. 28 is a diagram for explanation of the read operation executed by the flash storage device.

FIG. 31 is a table for explanation of a forced garbage collection (GC) control command applied to the flash storage device.

FIG. 32 is a table for explanation of address update notification transmitted from the flash storage device to the host.

FIG. 36 is a diagram for explanation of a relationship between the response to the write command and the callback processing for GC (address update notification).

FIG. 37 is a flowchart showing steps of the lookup table update processing executed by the host.

FIG. 38 is a diagram showing a configuration example of a block management table for management of a reference count.

FIG. 39 is a table for explanation of a duplicate command applied to the flash storage device.

FIG. 40 is a sequence chart showing reference count increment/decrement processing executed by the host and the flash storage device.

FIG. 44 is a block diagram showing a relationship between a flash translation unit in the host and a defective block translation unit in the flash storage device.

FIG. 45 is a block diagram showing a configuration example of the host (computing system).

FIG. 48 is a flowchart showing steps of the read operation executed by the host.

FIG. 49 is a flowchart showing steps of reference count increment/decrement processing executed by the host.

DETAILED DESCRIPTION

Various embodiments will be described hereinafter with reference to the accompanying drawings.

In general, according to one embodiment, a memory system connectable to a host, comprises a plurality of nonvolatile memory dies each including a plurality of blocks, and a controller electrically connected to the nonvolatile memory dies and configured to manage a plurality of parallel units each including blocks belonging to different nonvolatile memory dies.

Each of the parallel units has a unique first block address, each of the blocks in each nonvolatile memory die has a unique second block address, and second block addresses of blocks to be included in each parallel unit are determined from the first block address of each parallel unit, based on a mathematical rule.

The controller manages defect information holding at least 1-bit information indicative of being available or unavailable for each block in each parallel unit.

When receiving from the host a write request designating a third address to identify first data to be written, the controller selects one block from undefective blocks included in one parallel unit as a write destination block by referring to the defect information, determines a write destination location in the selected block, writes the first data to the write destination location, and notifies the host of a first physical address indicative of both of the selected block and the write destination location, and the third address.

Figure 1:
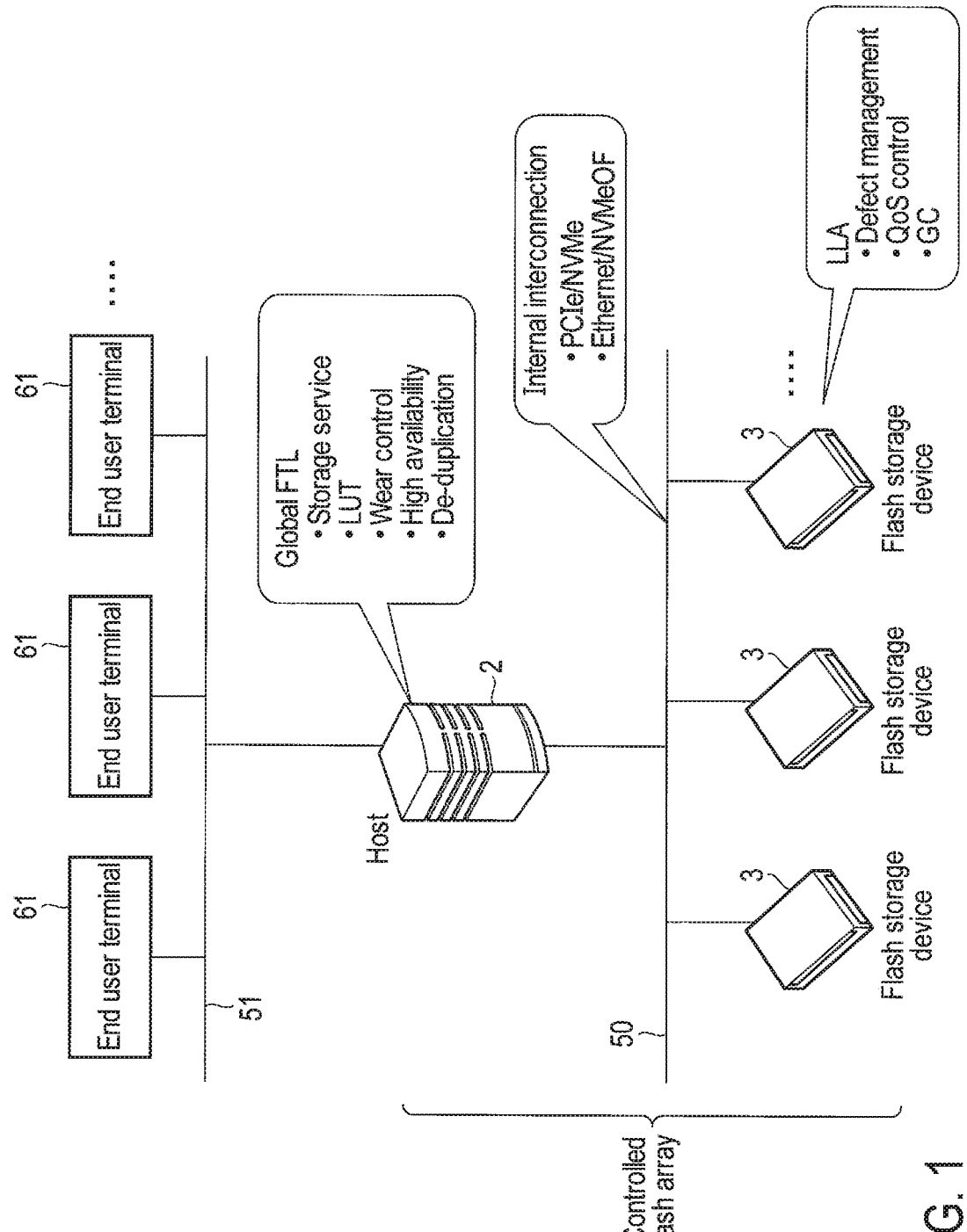
FIG. 1 is a block diagram showing a relationship between a host and a memory system (flash storage device).

First, a relationship between the host and the memory system will be explained with reference to FIG. 1.

The memory system is a semiconductor storage device configured to write data to a nonvolatile memory and to read data from the nonvolatile memory. The memory system is implemented as a flash storage device 3 based on the NAND flash technology.

The host (host device) 2 is configured to control plural flash storage devices 3. The host 2 is implemented by a computing system configured to use a flash array composed of the plural flash storage devices 3 as a storage. This computing system may be a server.

The flash storage device 3 may be utilized as one of plural flash storage devices provided in the storage array. The storage array may be connected to the computing system such as a server via a cable or a network. The storage array comprises a controller which controls plural storages (for example, plural flash storage devices 3) in the storage array. If the flash storage devices 3 are applied to the storage array, the controller of the storage array may function as the host of the flash storage devices 3.

An example in which the computing system such as the server functions as the host 2 will be explained below.

The host (server) 2 and the plural flash storage devices 3 are interconnected via an interface 50 (internal interconnection). The interface 50 for the internal interconnection is not limited to this, but PCI Express (PCIe) (registered trademark), NVM Express (NVMe) (registered trademark), Ethernet (registered trademark), NVMe over Fabrics (NVMeOF), and the like can be used as the interface.

A typical example of a server functioning as the host 2 is a server in a data center.

In a case where the host 2 is implemented by the server in the data center, the host (server) 2 may be connected to plural end user terminals (clients) 61 via a network 51. The host 2 can provide various services to the end user terminals 61.

Examples of services which can be provided by the host (server) 2 are (1) Platform as a Service (PaaS) which provides a system running platform to each client (each end user terminal 61), (2) Infrastructure as a Service (IaaS) which provides an infrastructure such as a virtual server to each client (each end user terminal 61), and the like.

Plural virtual machines may be executed on a physical server functioning as the host (server) 2. Each of the virtual machines running on the host (server) 2 can function as a virtual server configured to provide various services to several corresponding clients (end user terminals 61).

The host (server) 2 comprises a storage management function of managing the plural flash storage devices 3 constituting a flash array, and a front-end function of providing various services including the storage access to the end user terminals 61.

In the conventional SSD, a block/page hierarchical structure of a NAND flash memory is concealed by a flash translation layer (FTL) in SSD. In other words, FTL of the conventional SSD comprises (1) the function of managing mapping between each of the logical addresses and each of the physical addresses of the NAND flash memory, by using the lookup table which functions as the logical-to-physical address translation table, (2) the function of concealing read/write in page units and the erase operation in block units, (3) the function of executing the garbage collection (GC) of the NAND flash memory, and the like. Mapping between each of the logical addresses and each of physical addresses of the NAND flash memory cannot be seen from the host. The block/page structure of the NAND flash memory cannot be seen from the host, either.

A type of address translation (application-level address translation) is often executed in the host, too. This address translation manages mapping between each of the application-level logical addresses and each of the logical addresses for SSD, using the application-level address translation table. In addition, in the host, too, a type of GC (application-level GC) for change of data placement in the logical address space is often executed for cancellation of a fragment which occurs in the logical address space for SSD.

In a redundant configuration in which each of the host and SSD includes the address translation table (in which SSD includes the lookup table functioning as the logical-to-physical address translation table while the host includes the application-level address translation table), however, enormous volumes of memory resources are consumed to hold these address translation tables. Furthermore, duplex address translation including the address translation on the host side and the address translation on the SSD side is also a factor which degrades the I/O performance of the entire system.

Furthermore, the application-level GC on the host side becomes a factor which increases the amount of data written to SSD to a multiple (for example, double) of actual user data amount. Increase of the data write amount does not increase the write amplification of SSD, but degrades the storage performance of the entire system and shortens the life of SSD.

Thus, in the present embodiments, the role of FTL is shared by the host 2 and the flash storage device 3. The host 2 manages the lookup table which functions as the logical-to-physical address translation table, but the blocks and pages which should be used for write can be determined by not the host 2, but flash storage device 3. In addition, GC can also be executed by not the host 2, but the flash storage device 3. The FTL function moved to the host 2 is hereinafter called global FTL.

In addition, the flash storage device 3 manages plural parallel units (plural super blocks) each composed of plural blocks (plural physical blocks), to increase the write/read speed. The flash storage device 3 can execute in parallel the write operation and the read operation for the plural blocks included in a certain parallel unit (super block).

However, since several defective blocks are included in the NAND flash memory die, each of the defective blocks in the parallel unit is often replaced with the other block to secure the degree of parallel. However, if the number of defective blocks included in one NAND flash memory die is increased, the information amount for management of the replacement may be increased.

For example, in a case where the number of blocks included in one parallel unit is 64, to generate block addresses of each block from the block addresses indicative of the parallel unit by a mathematical rule, if the fifteenth block of 64 blocks is replaced with the block of block address 2049, at least 6 bits are required to represent the fifteenth number and 12 bits are required to represent 2049. As the number of blocks need to be replaced is increased, the information amount proportional to the number is required. If the number of blocks to be replaced is up to sixteen, the information of 18 bits×16=294 bits is required for each parallel unit.

In addition, in the data read operation, address translation for translating the address indicative of the defective block into the address indicative of the replacement destination block needs to be executed by using the replacement information. For this reason, if the number of defective blocks is increased, the time required for the address translation is increased in accordance with the increase in replacement information, and the read latency is increased.

Thus, in the write operation for writing the data from the host 2, the flash storage device 3 selects the write destination block from the undefective blocks (normal blocks) in the parallel unit to be written while avoiding the defective blocks in the parallel, and determines the write destination location in this write destination block. The data from the host 2 is written to the write destination location. Then, the flash storage device 3 notifies the host 2 of the physical address indicative of both of the write destination block and the write location in the write destination block. Thus, since the host 2 can recognize the block to which the write data has been actually written and the write destination location in this block, the host 2 can transmit the read request to designate this physical address to the flash storage device 3 if the data needs to be read. The flash storage device 3 can read the data from the write destination location in the above-explained selected block, based on the physical address designated by this read request. Therefore, the address translation processing is unnecessary and the read latency can be reduced, in the flash storage device 3.

The global FTL of the host 2 may comprise a function of executing a storage service, a function of managing the lookup table (LUT), a wear control function, a function of implementing high availability, a de-duplication function of preventing plural duplicated data portions having the same contents from being stored in a storage, and the like.

In contrast, the flash storage device 3 can execute low-level abstraction (LLA). LLA is a function for abstraction of the NAND flash memory. LLA includes a function of assisting the data placement. The function of assisting the data placement includes a function of determining the write destination location (block address and the location in this block) of the user data, a function of notifying an upper layer (host 2) of the physical address indicative of the write destination location to which the user data is written, a function of determining the copy source block and the copy destination block for the garbage collection, a function of notifying the upper layer (host 2) of the copy destination location of the valid data, and the like. In addition, LLA also comprises a QoS control function of executing resource management of the flash storage device 3 for each domain (QoS domain).

The QoS control function includes a function of determining the access unit (data grain) for each QoS domain. The access unit is indicative of the minimum data size (data grain) which the host 2 can write/read. The flash storage device 3 supports a single or plural access units (data grains) and, if the flash storage device 3 supports the plural access units, the host 2 can instructs the access units (data grains) which should be used for each QoS domain to the flash storage device 3.

In addition, the QoS control function includes a function of preventing as much performance interference between the QoS domains as possible. This function is basically a function of maintaining stable latency.

To implement this, the flash storage devices 3 may logically divide the inside of the NAND flash memory into plural regions (plural QoS domains). One region (i.e., one QoS domain) includes one or more parallel units (super blocks). Each of the parallel units (super blocks) belongs to only one certain region (QoS domain).

Figure 2:
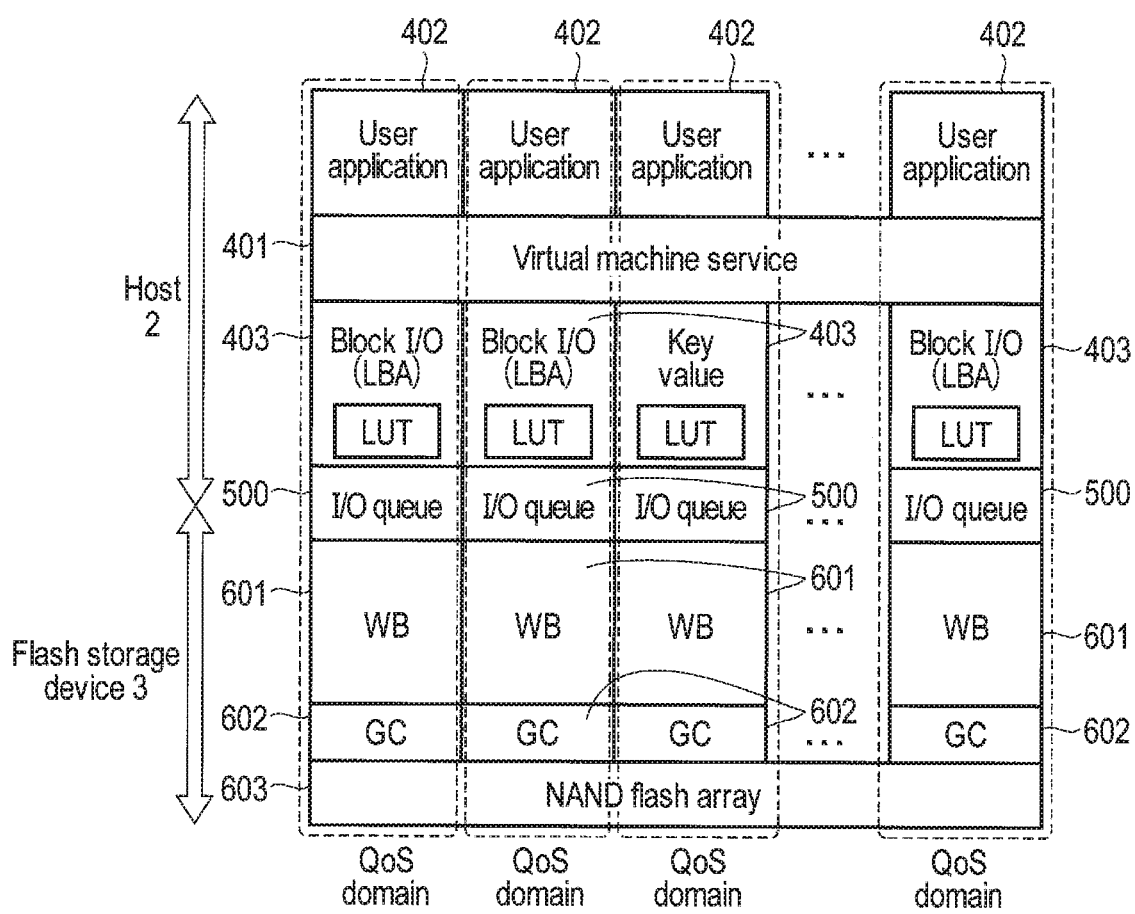
FIG. 2 is a diagram for explanation of role sharing between the host and the flash storage device.

FIG. 2 shows a hierarchical structure of the entire system including the host 2 and the flash storage device 3.

In the host (server) 2, a virtual machine service 401 for providing plural virtual machines to plural end users is executed. In each of the virtual machines on the virtual machine service 401, an operating system and user applications 402 used by the corresponding end users are executed.

In addition, in the host (server) 2, plural I/O services 403 corresponding to user applications 402 are executed. The I/O services 403 may include LBA-based block I/O service, key-value store service, and the like. Each of the I/O services 403 includes a lookup table (LUT) which manages mapping between each of the logical addresses and each of the physical addresses of the flash storage device 3. The logical address is indicative of an identifier (tag) which can identify data to be accessed. The logical address may be the logical block address (LBA) which designates a location in the logical address space, a key of the key-value store or a file identifier such as a file name.

In the LBA-based block I/O service, LUT which manages mapping between each of the logical addresses (LBAs) and each of the physical addresses of the flash storage device 3 may be used.

In the key-value store service, LUT 411 which manages mapping between each of the logical addresses (i.e., tags such as keys) and each of the physical addresses indicative of the physical storage locations in the flash storage device 3 in which the data corresponding to the logical addresses (i.e., tags such as keys) are stored may be used. In the LUT, relationship between the tag, the physical address at which data identified by the tag is stored, and a data length of the data may be managed.

Each of the end users can select an addressing method (LBA, the key of the key-value store, the file identifier, or the like) which should be used.

Each LUT does not translate each of the logical addresses from the user application 402 into each of the logical addresses for the flash storage device 3, but translates each of the logical addresses from the user application 402 into each of the physical addresses of the flash storage device 3. In other words, each LUT is a table in which the table for translating the logical address for the flash storage device 3 into the physical address and the application-level address translation table are integrated (merged).

In the host (server) 2, the I/O service 403 exists for each of the QoS domains. The I/O service 403 belonging to a certain QoS domain manages mapping between each of the logical addresses used by the user application 402 in the corresponding QoS domain and each of the physical addresses of the region allocated to the corresponding QoS domain.

Transmission of the command from the host (server) 2 to the flash storage device 3 and return of a response of command completion or the like from the flash storage device 3 to the host (server) 2 are executed via an I/O queue 500 which exists in each of the host (server) 2 and the flash storage devices 3. The I/O queues 500 may also be classified into plural queue groups corresponding to the QoS domains.

The flash storage device 3 comprises plural write buffers (WB) 601 corresponding to the QoS domains, plural garbage collection (GC) functions 602 corresponding to the QoS domains, and the NAND flash memories (NAND flash array) 603.

FIG. 3 shows a configuration example of the flash storage device 3.

The flash storage device 3 comprises a controller 4 and a nonvolatile memory (NAND flash memory) 5. The flash storage device 3 may comprise a random access memory, for example, a DRAM 6.

The NAND flash memory 5 comprises a memory cell array comprising plural memory cells arranged in a matrix. The NAND flash memory 5 may be a NAND flash memory of a two-dimensional structure or a NAND flash memory of a three-dimensional structure.

The memory cell array of the NAND flash memory 5 includes plural blocks BLK0 to BLKm−1. Each of the blocks BLK0 to BLKm−1 is formed of a number of pages (pages P0 to Pn−1 in this case). The blocks BLK0 to BLKm−1 function as erase units. The blocks are often referred to as "erase blocks", "physical blocks" or "physical erase blocks". Each of the pages P0 to Pn−1 comprises plural memory cells connected to the same word line. The pages P0 to Pn−1 are units for a data write operation and a data read operation.

The controller 4 is electrically connected to the NAND flash memory 5 which is a nonvolatile memory, via a flash I/O control circuit 13 such as toggle or open NAND flash interface (ONFI). The controller 4 is a memory controller (control circuit) configured to control the NAND flash memory 5.

The NAND flash memory 5 comprises plural NAND flash memory dies. The controller 4 manages the above-explained plural parallel units. Each of the parallel units is implemented by a super block which is a block group including plural blocks (plural physical blocks) belonging to different NAND flash memory dies, respectively. The controller 4 can execute in parallel the write operation and the read operation for the plural blocks included in each of the parallel units (super blocks). Each of the plural parallel units (super blocks) includes a unique super block address (first block address). Each of the plural blocks in each nonvolatile memory die includes a unique block address (second block address). The block address of each of the blocks which should be included in each of the parallel units (super blocks) is determined from the super block address of each parallel unit, based on a mathematical rule.

The controller 4 comprises a host interface 11, a CPU 12, the flash I/O control circuit 13, a DRAM interface 14, and the like. The host interface 11, the CPU 12, the flash I/O control circuit 13, and the DRAM interface 14 are interconnected via the bus 10.

The host interface 11 is a host interface circuit configured to perform communication with the host 2. The host interface 11 may be, for example, a PCIe controller (NVMe controller). The host interface 11 receives various requests (commands) from the host 2. The requests (commands) include a write request (write command), a read request (read command), and the other various requests (commands).

The CPU 12 is a processor configured to control the host interface 11, the flash I/O control circuit 13, and the DRAM interface 14. The CPU 12 loads a control program (firmware) from the NAND flash memory 5 or a ROM (not shown) to the DRAM 6 in response to power-on of the flash storage device 3 and executes various processing by executing the firmware. The firmware may be loaded into a SRAM in the controller 4, which is not illustrated in the drawings. The CPU 12 can execute command processing for processing various commands from the host 2, and the like. Operations of the CPU 12 can be controlled by the above-described firmware executed by the CPU 12. A part or all parts of the command processing may be executed by exclusive hardware in the controller 4.

The CPU 12 can function as a write operation control unit 21, a read operation control unit 22, and a GC operation control unit 23. An application program interface (API) for implementing the system configuration shown in FIG. 2 is installed in the write operation control unit 21, the read operation control unit 22, and the GC operation control unit 23.

The write operation control unit 21 receives from the host 2 the write request (write command) designating the logical address (tag) identifying the data (user data) to be written. When the write operation control unit 21 receives the write command, the write operation control unit 21 first selects one block of undefective blocks included in the parallel unit (super block) to be written as a write destination block, by referring to a defect information management table 33. The defect information management table 33 holds defect information holding at least 1-bit information indicative of being available or unavailable for each of the blocks included in each of the parallel units (super blocks). The defect information corresponding to each of the super blocks may be a bit map including the same number of bits as the number of blocks included in each of the super blocks. The write operation control unit 21 can recognize whether each block in the parallel unit to be written is a defective block or an undefective block, by referring to the defect information (defect information management table 33) corresponding to the parallel unit (super block) to be written.

The defect information is not limited to the above-explained bit map, but information indicative of the number of erase cycles of each block (i.e., number of program/erase cycle) may be used instead as the defect information. In this case, the controller 4 may determine the block having the number of erase cycles more than or equal to a certain threshold value as the defective block.

The defective block is an unavailable block and is referred to as "bad block". The defective block (bad block) indicated by the defect information may include the defective block (primary defective block) occurring in the process of manufacturing the NAND flash memory, the defective block (grown defective block) occurring after the start of use of the flash storage device 3, or both of the primary defective block and the grown defective block. The undefective block is an available block, i.e., a block except the defective block.

The write operation control unit 21 determines the write destination location (page, and location in this page) in the selected write destination block. Next, the write operation control unit 21 writes the data (write data) from the host 2 to the write destination location of the write destination block. In this case, the write operation control unit 21 can write not only the data from the host 2, but also both of the data and the logical address (tag) of the data to the write destination block.

Then, the write operation control unit 21 returns to the host 2 the designated logical address (tag) and the physical address indicative of both of the write destination block and the write destination location.

In this case, the physical address may be represented by the die identifier, the physical block address (second block address), and the offset. The die identifier is a unique identifier of each nonvolatile memory die. The die identifier included in the physical address is indicative of the die identifier of the nonvolatile memory die to which the write destination block belongs. The physical block address is a block address (block number) for identifying each of the plural blocks in each nonvolatile memory die. The block address included in the physical address is indicative of the block address of the write destination block. The offset is an in-block offset. The offset included in the physical address is indicative of an offset (offset value) from the leading part of the write destination block to the write destination location. This offset may be represented by the page address of the page to which the write destination location belongs, and the in-page offset corresponding to the write destination location.

Alternatively, the physical address may be represented by the super block address (first block address) and the offset. The super block address is a unique block address of each super block. The super block address included in the physical address is indicative of the super block address of the super block to be written. The offset is indicative of an offset (offset value) from the leading part of the super block to be written to the write destination location. This offset may be represented by the die identifier of the nonvolatile memory die to which the write destination block belongs, the page address of the page to which the write destination location belongs, and the in-page offset corresponding to the write destination location.

The physical address is also referred to as "flash address".

The write command may not designate the only logical address (tag), but may designate the super block address. If the write operation control unit 21 receives the write command to designate the super block address, the write operation control unit 21 selects the super block having the super block address designated by the write command, of the plural super blocks, as the parallel unit (write destination super block) to be written.

If the read operation control unit 22 receives the read request (read command) designating the physical address (indicative of the block to be read and the location to be read in the block) from the host 2, the read operation control unit 22 reads the data from the location to be read, in the block to be read, based on this physical address.

When the GC operation control unit 23 executes the garbage collection of the NAND flash memory 5, the GC operation control unit 23 selects the copy source block (GC source block) and the copy destination block (GC destination block) for the garbage collection from the plural blocks in the NAND flash memory 5. Each of the GC source block and the GC destination block may be a super block or a physical block.

The GC operation control unit 23 generally selects plural copy source blocks (GC source blocks) and at least one copy destination block (GC destination block). A condition (GC policy) for selecting the copy source blocks (GC source blocks) may be designated by the host 2. For example, a GC policy of selecting the block in which the valid data amount is the smallest as the copy source block (GC source block) in priority may be used or the other GC policy may be used. Thus, the selection of the copy source block (GC source block) and the copy destination block (GC destination block) is executed by not the host 2, but the controller 4 (GC operation control unit 23) of the flash storage device 3. The controller 4 may manage the valid data amount of each of the blocks by using each of the block management blocks.

Management of valid data/invalid data may be executed by using the block management table 32. The block management table 32 may exist, for example, for each of the super blocks. In the block management table 32 corresponding to a certain super block, a bit map flag indicative of validity/invalidity of the data in each block in this super block is stored. The valid data as used herein means data which is referred to from the LUT (i.e., data linked to a certain logical address as the latest data) and may subsequently be read by the host 2. The invalid data means data which no longer has a possibility of being read from the host 2. For example, data associated with a certain logical address is valid data, and data unassociated with logical address is invalid data.

The GC operation control unit 23 determines a location (copy destination location) in the copy destination block (GC destination block) to which the valid data stored in the copy source block (GC source block) should be written, and copies the valid data to the determined location (copy destination location) of the copy destination block (GC destination block). In this case, the GC operation control unit 23 may copy both of the valid data and the logical address of the valid data to the copy destination block (GC destination block). The GC operation control unit 23 may specify the valid data in the GC source block by referring to the block management table 32 corresponding to the copy source block (GC source block). Alternatively, the host 2 may designate the GC source block and the GC destination block, in the other embodiments. The GC source block and the GC destination block may be super blocks or physical blocks.

Then, the GC operation control unit 23 notifies the host 2 of the logical address (tag) of the copied valid data, the physical address indicative of the previous physical storage location of the copied valid data, and the physical address indicative of the new physical storage location of the copied valid data.

In the present embodiments, as explained above, the write operation control unit 21 can write both of the data (write data) from the host 2 and the logical address (tag) from the host 2 to the write destination block. For this reason, since the GC operation control unit 23 can easily acquire the logical address of each of the data in the copy source block (GC source block) from the copy source block (GC source block), the GC operation control unit 23 can easily notify the host 2 of the logical address of the copied valid data.

The flash I/O control circuit 13 is a memory control circuit configured to control the NAND flash memory 5 under the control of the CPU 12. The DRAM interface 14 is a DRAM control circuit configured to control the DRAM 6 under the control of the CPU 12. A part of a storage region of the DRAM 6 is used to store a read buffer (RB) 30, a write buffer (WB) 31, the block management table 32, and the defect information management table 33. The read buffer (RB) 30, the write buffer (WB) 31, the in-block LUT 32, and the block management table 32 may be stored in SRAM (not shown) in the controller 4.

Next, API used as a software interface between the flash storage devices 3 and the host 2 will be explained. In the embodiments, the APIs are roughly classified into In-Drive-GC API and super block API.

In-Drive-GC API includes a command group based on a feature that the flash storage device 3 executes the garbage collection (GC) by itself. The command group may include as basic commands, a write command (Write without Physical Address), a read command (Read with Physical Address), a Trim command (Trim), a duplication command (Duplicate), an address update notification (Address Update Notification (Device Initiated)), a forced GC command (Forced Garbage-Collection), a GC control command (Garbage Collection Control), and the like.

The write command (Write without Physical Address) is a write command which designates the logical address (tag) identifying the user data to be written and which does not designate the physical address of the write destination.

The read command (Read with Physical Address) is a read command which designates the physical address indicative of the physical storage location to be read (i.e., the physical block to be read and the location to be read in the physical block).

The trim command (Trim) is a command which designates the physical address of the data to be invalidated and which instructs the storage device 3 to invalidate the data corresponding to the physical address. If the host 2 support the de-duplication function of preventing the plural duplicated data portions having the same contents from being stored in the storage, the trim command (Trim) is used as a command instructing the storage device 3 to decrease a reference count indicative of the number of the logical addresses referring to certain data. The duplication command (Duplicate) is used as a command for instructing the storage device 3 to increase the reference count indicative of the number of the logical addresses referring to certain data.

The Address Update Notification (Device Initiated) is used to permit the storage device 3 to notify the host 2 of the logical address of the copied data (valid data), the previous physical storage location of the valid data, and a new physical storage location of the valid data after the data copy operation for GC is executed by the flash storage device 3.

The forced GC command (Forced Garbage-Collection) is a command for forcing the flash storage device 3 to execute GC.

The GC control command (Garbage Collection Control) is a command for instructing the condition for starting the GC, and the like to the flash storage device 3.

FIG. 4 shows an example of parameters and return values of the respective commands for In-Drive-GC API.

In FIG. 4, contents described subsequently with label "Host:" are parameters designated by the corresponding commands, and contents described subsequently with label "Device:" are parameters (return values) included in the response to this command.

The write command (Write without Physical Address) may include the user address, the length, the data, and the QoS domain identifier. The user address is the logical address (tag) for identifying the data which should be read. Each of the user addresses includes LBA, the key of the key-value store, the file identifier, and the like.

The response to the write command may include status (success/failure), the user address, flash address (physical address), the length, and the remaining writable data amount (distance-to-block-boundary). The remaining writable data amount (distance-to-block-boundary) is an optional return value, which is indicative of the remaining data amount writable to the super block to which the data is written. The remaining writable data amount (distance-to-block-boundary) may be represented by a multiple of the grain of the above-explained data. The data is often written across two undefective blocks before and after the defective block. For this reason, the response to the write command may include plural sets each including the user address, flash address (physical address), and the length.

The read command (Read with Physical Address) may include the flash address and the length. The read command (Read with Physical Address) may include plural sets each including the flash address and the length. The response to the read command may include the status, the user address, the length, the data, and the like. The response to the read command may include plural sets each including the user address and the length. The trim command (Trim)/duplication command (Duplicate) may include the flash address, the length, and the amount of increase and decrease of the reference count (reference-count-to-add-or-subtract). The trim command (Trim)/duplication command (Duplicate) may include plural sets each including the flash address, the length, and the amount of increase or decrease of the reference count.

The Address Update Notification (Device Initiated) may include the user address, the previous flash address, the new flash address, the reference count, and the length as output parameters of which the host 2 is notified by the flash storage device 3. For example, the flash storage device 3 transmits the Address Update Notification (Device Initiated) to host 2 after copying the data from the previous physical storage location to the new physical storage location. The Address Update Notification (Device Initiated) may include the user address of the data, the previous flash address indicative of the previous physical storage location of the data, the new flash address indicative of the new physical storage location of the data, the reference count indicative of the number of logical addresses referring to the data, and the length of the data. The address update notification (Address Update Notification (Device Initiated)) may include plural sets each including the user address, the previous flash address, the new flash address, the reference count, and the length.

The forced GC command (Forced Garbage-Collection) may include the QoS domain identifier and a source super block address (optional).

The GC control command (Garbage Collection Control) may include the maximum number of the data to be copied (maximum-number-of-data), the QoS domain identifier, and the GC method (policy).

The super block API includes command groups based on a feature that the host 2 designates the logical address (tag) and the super block address and the flash storage device determines the write destination block in the super block and the write destination location in the write destination block. The command groups include as basic commands, a write command (Write without Page Address), a read command (Read with Physical Address), a super block release command (Release Super Block to Unused Super Block Pool), a super block allocate command (Allocate Super Block and Open Write Buffer with Block Healing), a close super block command (Close Super Block and Write Buffer), a super block information command (Super Block Information), a non-copy data set command (Set Data not to be Copied), a data copy command (Data Copy without Page Address), and the like.

The write command (Write without Page Address) is a write command which designates the logical address (tag) and the super block address. The read command is the same as the read command for In-Drive-GC API. The super block release command (Release Super Block to Unused Super Block Pool) is a command for releasing the already allocated super block. The super block allocate command (Allocate Super Block and Open Write Buffer with Block Healing) is a command for requesting allocation of the super block. The super block allocate command (Allocate Super Block and Open Write Buffer with Block Healing) may include a parameter designating a parallel number indicative of the number of blocks capable of parallel access. The super block information command (Super Block Information) is a command for obtaining information on a specific super block. The non-copy data set command (Set Data not to be Copied) is a command for designating the data which should not be copied in the super block. The data copy command (Data Copy without Page Address) is a command for copying data for GC. Examples of the parameters and return values of these commands are shown in FIG. 5. In FIG. 5, too, contents described subsequently with label "Host:" are indicative of parameters designated by the corresponding commands, and contents described subsequently with label "Device:" are indicative of parameters (return values) included in the response to this command.

Figure 6:
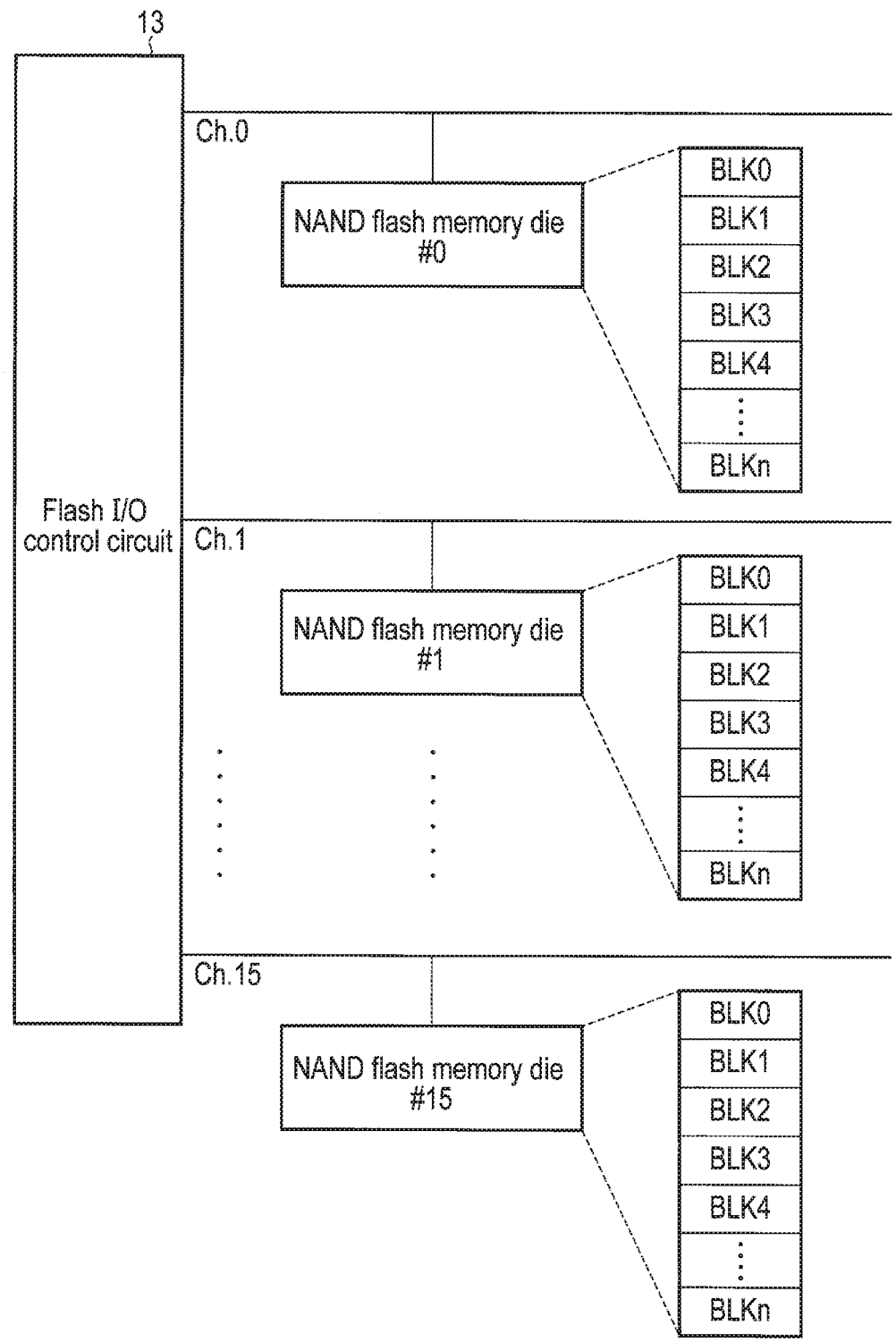
FIG. 6 is a block diagram showing a relationship between a flash I/O control circuit and plural NAND flash memory dies provided in the flash storage device.

FIG. 6 shows a relationship between the flash I/O control circuit 13 and the plural NAND flash memory dies.

As illustrated in FIG. 6, the NAND flash memory 5 comprises the plural NAND flash memory dies. Each of the NAND flash memory dies is a nonvolatile memory die comprising a memory cell array comprising plural blocks (physical blocks) BLK and a peripheral circuit which controls the memory cell array. The individual NAND flash memory dies can operate independently. Thus, the NAND flash memory dies function as minimum parallel operation units. The NAND flash memory dies are referred to as "NAND flash memory chips" or "nonvolatile memory chips". FIG. 6 illustrates a case where sixteen channels Ch0, Ch1, . . . Ch15 are connected to the flash I/O control circuit 13 and the same number (for example, one die per channel) of NAND flash memory dies are connected to each of the channels Ch0, Ch1, . . . Ch15. Each of the channels comprises a communication line (memory bus) for communication with the corresponding NAND flash memory dies.

The controller 4 controls NAND flash memory dies #0 to #15 via the channels Ch0, Ch1, . . . Ch15. The controller 4 can simultaneously drive the channels Ch0, Ch1, . . . Ch15.

In the configuration example shown in FIG. 6, a maximum of sixteen NAND flash memory dies can be operated in parallel.

In the present embodiments, the controller 4 manages plural parallel units (super blocks) each of which is composed of plural blocks BLK. The super blocks are not limited to these but may include a total of sixteen blocks BLK selected from the NAND flash memory dies #0 to #15 connected to different channels. Each of the NAND flash memory dies #0 to #15 may have a multi-plane configuration. For example, if each of the NAND flash memory dies #0 to #15 has the multi-plane configuration including two planes, one super block may include a total of thirty-two blocks BLK selected from thirty-two planes corresponding to the NAND flash memory dies #0 to #15, respectively.

Figure 7:
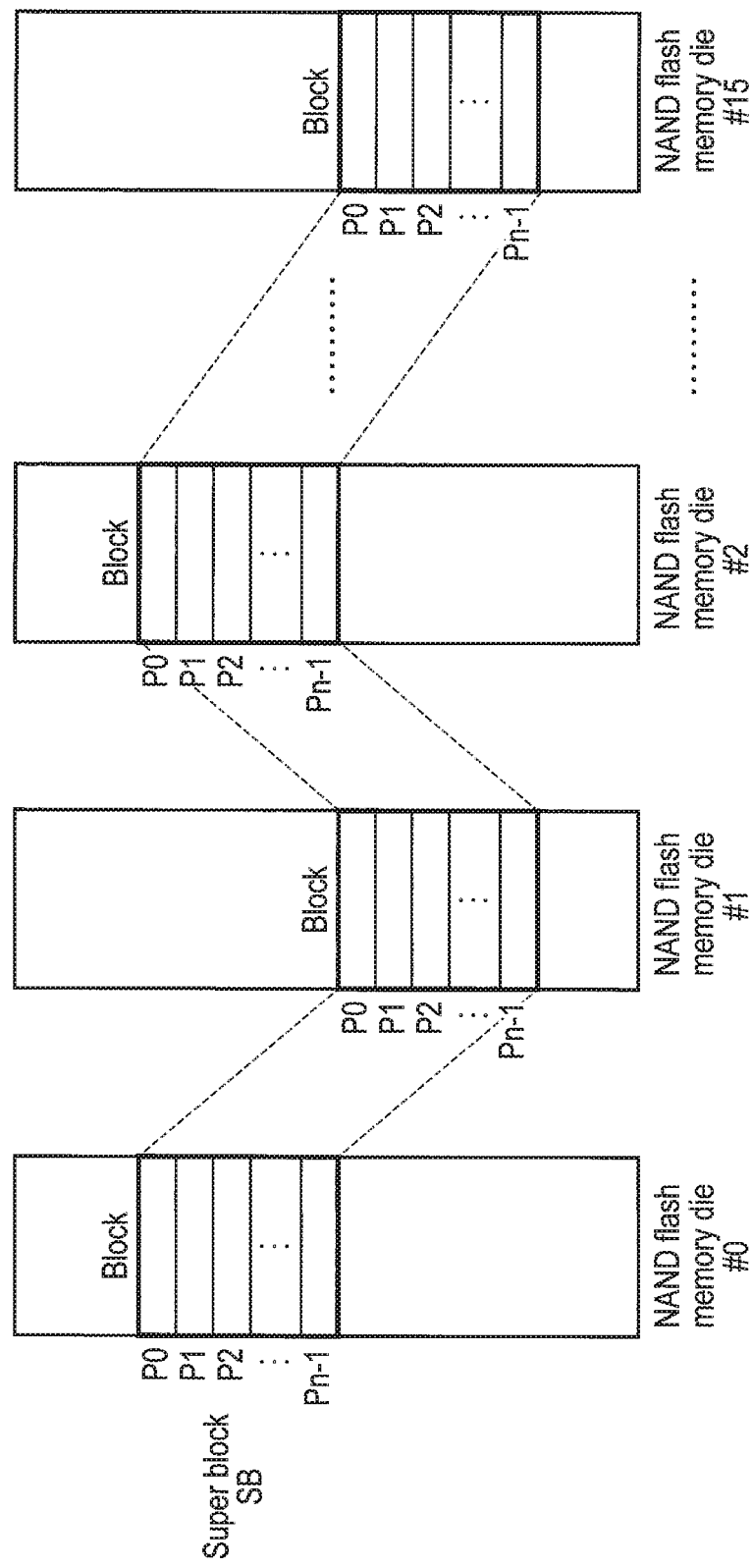
FIG. 7 is a diagram showing a configuration example of a super block (parallel unit) configured by a set of plural blocks.

FIG. 7 illustrates a case where one super block SB is composed of a total of sixteen blocks BLK selected from the NAND flash memory dies #0 to #14, respectively. The one super block SB includes one block selected from the blocks in the NAND flash memory dies #0, one block selected from the blocks in the NAND flash memory dies #1, one block selected from the blocks in the NAND flash memory dies #2, . . . one block selected from the blocks in the NAND flash memory dies #15. In the operation of writing data to the super block SB, the data are written in order of page P0 of the block BLK in the NAND flash memory die #0, page P0 of the block BLK in the NAND flash memory die #1, page P0 of the block BLK in the NAND flash memory die #2, . . . page P0 of the block BLK of the NAND flash memory die #15, page P1 of the block BLK in the NAND flash memory die #0, page P1 of the block BLK in the NAND flash memory die #1, page P1 of the block BLK in the NAND flash memory die #2, . . . page P1 of the block BLK in the NAND flash memory die #15, . . . .

Figure 8:
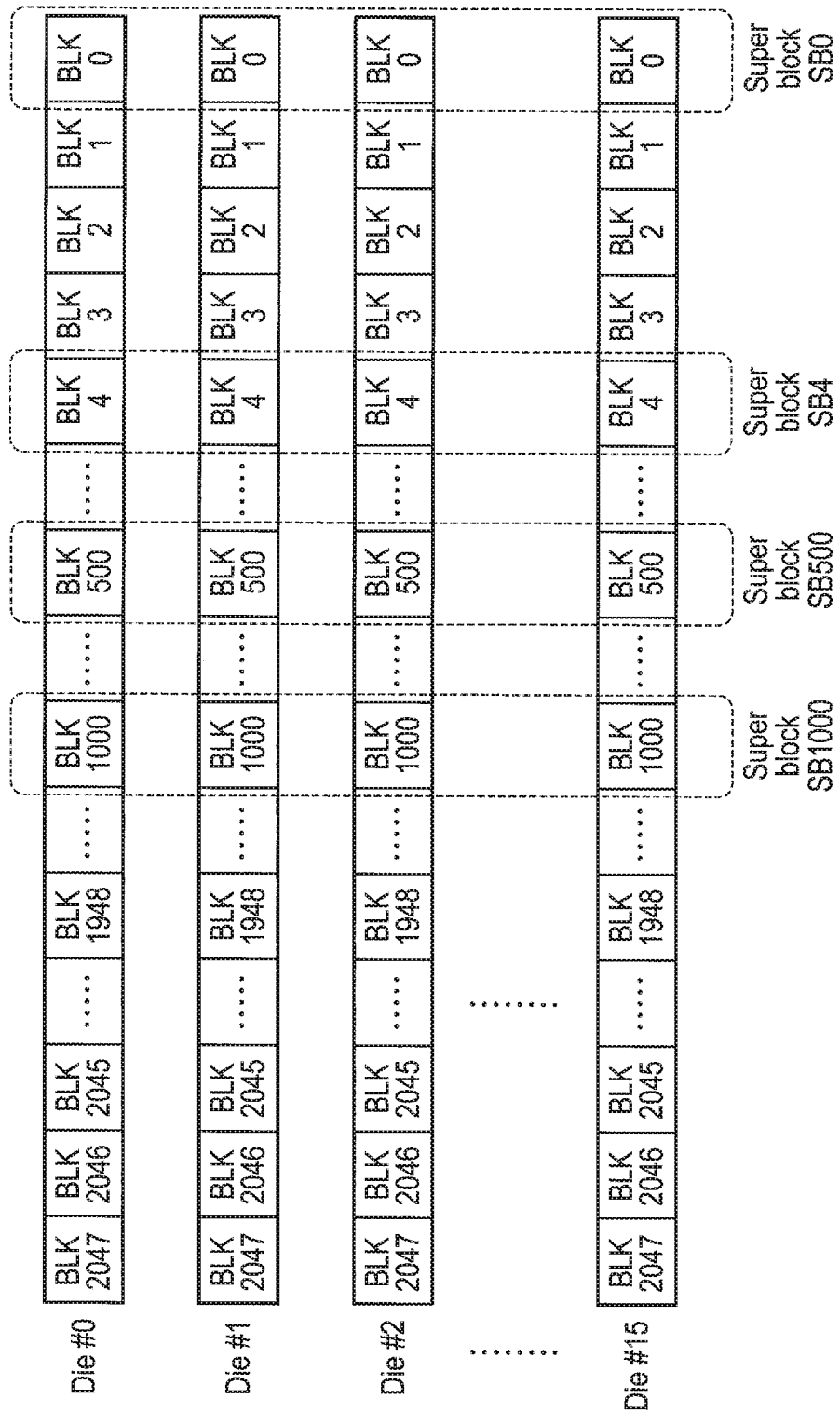
FIG. 8 is a diagram for explanation of a relationship between a block address of the super block and block addresses the plural blocks constituting the super block.

FIG. 8 shows a relationship between block address (super block address) of the super block SB and block address in each of the plural blocks (physical blocks) constituting the super block SB.

The block address of each of the blocks (physical blocks) which should be included in the super block SB is determined from the block address (super block address) of the super block SB, based on a mathematical rule.

For example, a value obtained by subjecting the super block addresses of the super block SB to predetermined four arithmetic operations may be determined as the block address of each of the blocks which should be included in the super block SB. Alternatively, a value obtained by subjecting plural bits indicative of the super block address of the super block SB to predetermined bit inversion or predetermined bit shift may be determined as the block address of each of the blocks which should be included in the super block SB.

FIG. 8 shows an example that the super block SB is composed of the blocks having the same block addresses as the super block address of the super block SB, to simplify the illustration.

Superblock SB0 having super block address 0 is composed of block BLK0 of block address 0 included in the NAND flash memory die #0 (Die #0), block BLK0 of block address 0 included in the NAND flash memory die #1 (Die #1), block BLK0 of block address 0 included in the NAND flash memory die #2 (Die #2), . . . , block BLK0 of block address 0 included in the NAND flash memory die #15 (Die #15).

Similarly, super block SB1000 having super block address 1000 is composed of block BLK1000 of block address 1000 included in the NAND flash memory die #0 (Die #0), block BLK1000 of block address 1000 included in the NAND flash memory die #1 (Die #1), block BLK1000 of block address 1000 included in the NAND flash memory die #2 (Die #2), . . . , block BLK1000 of block address 1000 included in the NAND flash memory die #15 (Die #15).

Each Die often includes several defective blocks. In general, the number of defective blocks is different in each Die.

Figure 9:
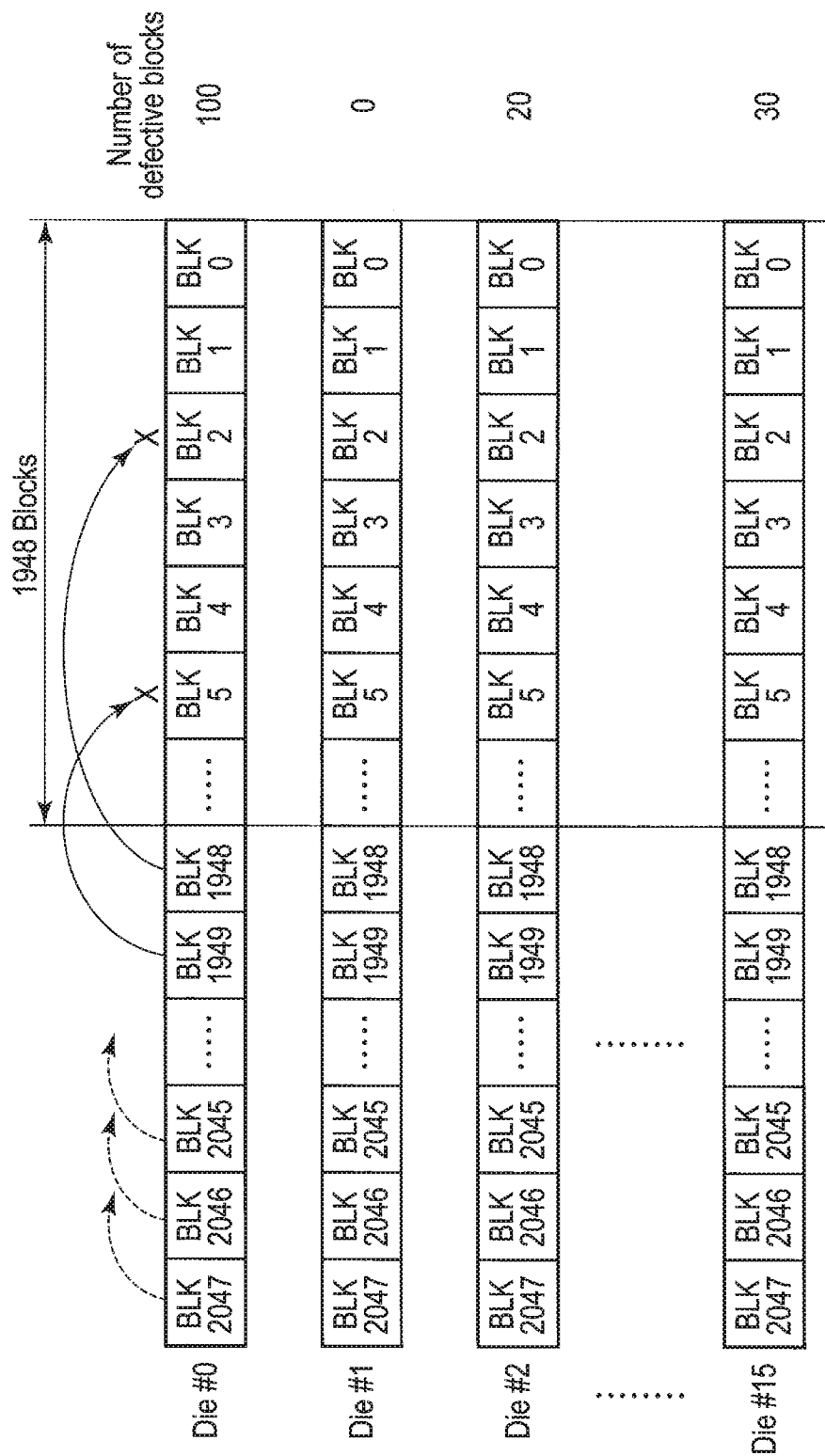
FIG. 9 is a diagram for explanation of an operation of replacing defective blocks belonging to a certain nonvolatile memory die with the other blocks in this nonvolatile memory die, respectively.

FIG. 9 shows processing of replacing each of the defective blocks in each Die with the other block belonging to the same Die.

In FIG. 9, it is assumed that each Die includes 2048 blocks BLK, that Die #0 includes 100 defective blocks, that Die #1 does not include a defective block, that Die #2 includes 20 defective blocks, and that Die #15 includes 30 defective blocks.

In the Die #0, for example, defective block BLK2 is replaced with undefective block BLK1948 of the Die #0, and defective block BLK5 is replaced with undefective block BLK1949 of Die #0. Thus, a total of 1948 (=2048−100) blocks alone from the leading block of the Die #0 become available, and remaining blocks BLK1948 to BLK2047 of the Die #0 cannot be used.

For this reason, even if Die #1 does not include a defective block, blocks BLK1948 to BLK2047 of the Die #1 become unavailable to constitute the super blocks. The number of super blocks SB which can be constituted is therefore limited to the number of undefective blocks in the Die #0 including the most defective blocks.

FIG. 10 shows an operation of selecting a write destination block from undefective blocks in a certain super block without replacing each defective block.

In FIG. 10, a certain super block (super block SB5 in this case) is composed of eight blocks, i.e., block BLK5 in Die #0, block BLK5 in Die #1, block BLK5 in Die #2, block BLK5 in Die #3, block BLK5 in Die #4, block BLK5 in Die #5, block BLK5 in Die #6, and block BLK5 in Die #7, to simplify the illustration.

In the embodiments, a defect information management table 33 corresponding to each of the super blocks is provided. In the defect information management table 33 for super block SB5, defect information (bit map) including 1-bit information indicative of being available or unavailable for each block. In the defect information (bit map), "0" represents an undefective block and "1" represents a defective block.

In FIG. 10, it is assumed that block BLK5 in Die #1, block BLK5 in Die #4, and block BLK5 in Die #5 are defective blocks.

The controller 4 does not execute processing of replacing block BLK5 in Die #1 with the other block in Die #1, processing of replacing block BLK5 in Die #4 with the other block in Die #4, and processing of replacing block BLK5 in Die #5 with the other block in Die #5. Instead, the controller 4 selects one block of the undefective blocks (block BLK5 in Die #0, block BLK5 in Die #2, block BLK5 in Die #3, block BLK5 in Die #6, and block BLK5 in Die #7) included in the super block SB5 as the write destination block, by referring to the defect information management table 33 for super block SB5. The controller 4 determines the write destination location in the write destination block, and writes the write data from the host 2 to the write destination location in the write destination block. Then, the controller 4 notifies the host 2 of the physical address indicative of both of the write destination block and the write destination location.

Thus, since the host 2 can recognize the block (write destination block) to which the write data has been actually written and the write destination location in this block, the host 2 can transmit a read request (read command) to designate the physical address of which the host 2 is notified to the flash storage device 3 if the write data needs to be read. In other words, the host 2 first transmits the write request (write command) including the logical address (tag) identifying the data to be written to the flash storage device 3. The host 2 receives from the flash storage device 3 the physical address indicative of both of the block selected from the blocks except the defective block as the write destination block and the write destination location (physical storage location) in this block, and the logical address (tag) of this data. The host 2 updates the lookup table (LUT) on the host 2 which manages mapping between each of the logical addresses (tags) and each of the physical addresses of the flash storage device 3, and maps the received physical address to the logical address (tag) identifying this data. If the host 2 needs to read this data, the host 2 obtains the physical address mapped to the logical address (tag) of this data and transmits the read request (read command) designating the obtained physical address, by referring the lookup table (LUT) on the host 2.

Thus, in the embodiments, data write and read operations for the super block can be normally operated without replacing the defective block in the super block to be written with the other block in the Die to which this defective block belongs. Therefore, even if the number of defective blocks is increased, a large amount of replacement information does not need to be managed. In addition, since the address translation processing for replacement is also unnecessary, read latency can be reduced. Furthermore, since the same number of super blocks as the number of blocks belonging to each Die can be basically constructed, almost all of the undefective blocks can be used even if the number of the defective blocks is increased.

FIG. 11 shows the write command (Write without Physical Address) applied to the flash storage device 3.

This write command is a command to request the flash storage device 3 to write the data. This write command may include the command ID, the QoS domain ID, the user address, the length, and the like as explained above.

The command ID is an ID (command code) indicating that this command is the write command, and the command ID for the write command is included in the write command.

The QoS domain ID is an identifier capable of uniquely identifying the QoS domain to which the data should be written. A write command transmitted from the host 2 in response to a write request from a certain end user may include the QoS domain ID designating the QoS domain corresponding to the end user. The namespace ID may be handled as the QoS domain ID.

The user address is the logical address (tag) identifying the data and corresponds to, for example, LBA, the key, and the file identifier.

The length is indicative of the length of the write data to be written. The length may be designated by the number of LBA or its size may be designated by bytes.

FIG. 12 shows a response to the write command shown in FIG. 11.

This response includes the user address, flash address, the length, and the remaining writable data amount (distance-to-block-boundary).

The user address is a user address included in the write command shown in FIG. 11.

The flash address is indicative of a physical address of a physical storage location in the NAND flash memory 5 to which data has been written in response to the write command shown in FIG. 11.

In the present embodiments, the physical address is designated by, for example, a combination of the die identifier, the block address, and the offset (in-block offset), or a combination of the super block address and the offset (offset in super block).

The length is indicative of the length of the written write data. The length may be designated by the number of LBA or its size may be designated by bytes.

The remaining writable data amount (distance-to-block-boundary) is indicative of the data amount writable to the super block to which the data has been written.

FIG. 13 shows the Trim command applied to the flash storage device 3.

The Trim command includes the command ID, the flash address, the length, and the reference-count-to-subtract.

The command ID is an ID (command code) indicating that this command is the Trim command, and the command ID for Trim command is included in the Trim command.

The flash address is indicative of a first physical storage location where the data to be invalidated (data in which the reference count should be decremented) is stored. In the present embodiments, the flash address is designated by a combination of the die identifier, the block address, and the offset (in-block offset), or a combination of the super block address and the offset (offset in super block).

The length is indicative of the length of the data to be invalidated (data in which the reference count should be decremented). This length (data length) may be designated by bytes.

The controller 4 manages a flag (bit map flag) indicative of validity/invalidity of each of the data included in each of the plural super blocks, by using the block management table 32. If the controller 4 receives from the host 2 the Trim command including the flash address indicative of the physical storage location in which the data to be invalidated is stored, the controller 4 updates the block management table 32, and changes the flag (bit map flag) corresponding to the data of the physical storage location corresponding to the flash address included in the Trim command to a value indicative of invalidity.

In a case of supporting the de-duplication function, a reference count corresponding to the data included in each of the plural super blocks is managed in the block management table 32. The reference-count-to-subtract is indicative of the amount by which the reference count should be decremented.

Figure 14:
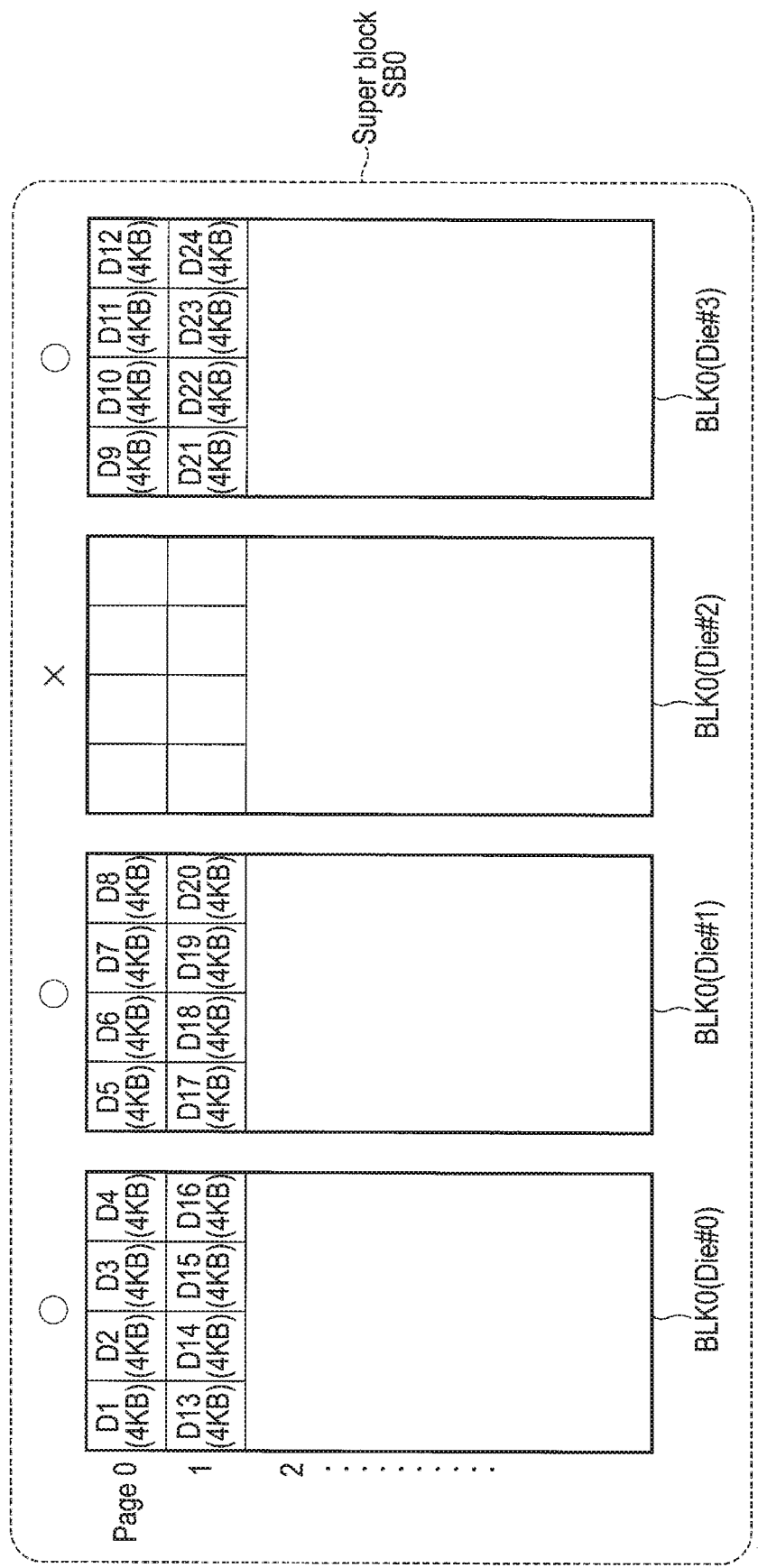
FIG. 14 is a diagram showing an operation of writing data to the super block including a defective block.

Next, an operation of writing the data to the super block including a defective block will be explained with reference to FIG. 14.

To simplify the illustration, it is assumed that one certain super block SB #0 is composed of four blocks BLK0 (Die #0), BLK0 (Die #1), BLK0 (Die #2), and BLK0 (Die #3) and that BLK0 (Die #2) is a defective block.

The controller 4 writes the data in order of page 0 of block BLK0 (Die #0), page 0 of block BLK0 (Die #1), page 0 of block BLK0 (Die #3), page 1 of block BLK0 (Die #0), page 1 of block BLK0 (Die #1), page 1 of block BLK0 (Die #3), . . . so as to avoid the defective block.

If the page size is 16K bytes (16 KB) and the grain of the data is 4K bytes (4 KB), the first 16K-byte data (D1 to D4) are written to page 0 of the block BLK0 (Die #0). Subsequent 16K-byte data (D5 to D8) are written to page 0 of the block BLK0 (Die #1). Write to BLK0 (Die #2) is skipped, and subsequent 16K-byte data (D9 to D12) are written to page 0 of the block BLK0 (Die #3).

Figure 15:
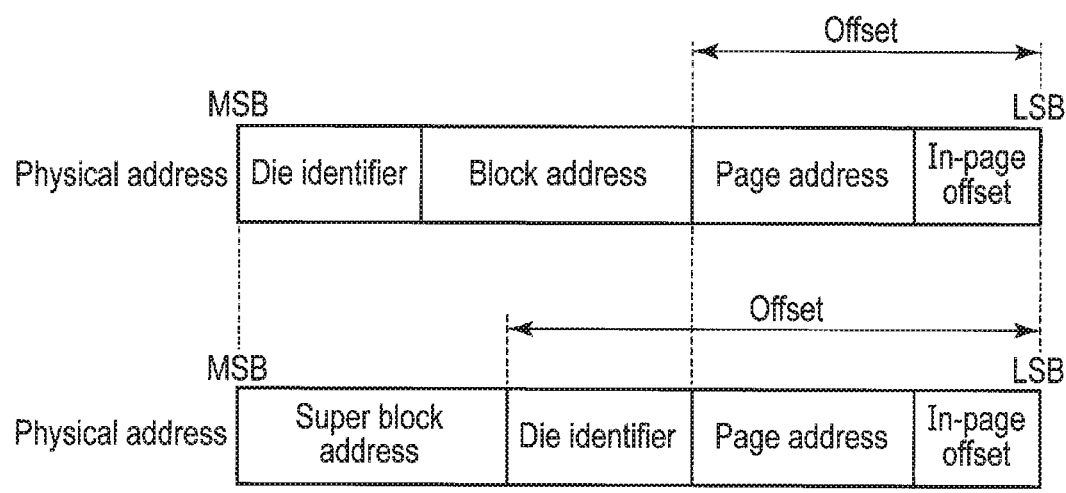
FIG. 15 is a diagram showing configuration examples of the physical address included in the response shown in FIG. 12.

FIG. 15 shows a configuration example of the physical address included in the response shown in FIG. 12.

As shown in an upper part of FIG. 15, the physical address is composed of the die identifier of the die to which the block selected as the write destination block belongs, the block address corresponding to the selected block, and the offset from a leading part of the selected block to the write destination location. The offset from a leading part of the selected block to the write destination location includes the page address and the in-page offset.

Alternatively, as shown in a lower part of FIG. 15, the physical address is composed of the block address (super block address) corresponding to the super block to which the write destination block belongs, and the offset from a leading part of the super block to the write destination location. The offset from a leading part of the super block to the write destination location includes the die identifier, the page address and the in-page offset.

Figure 16:
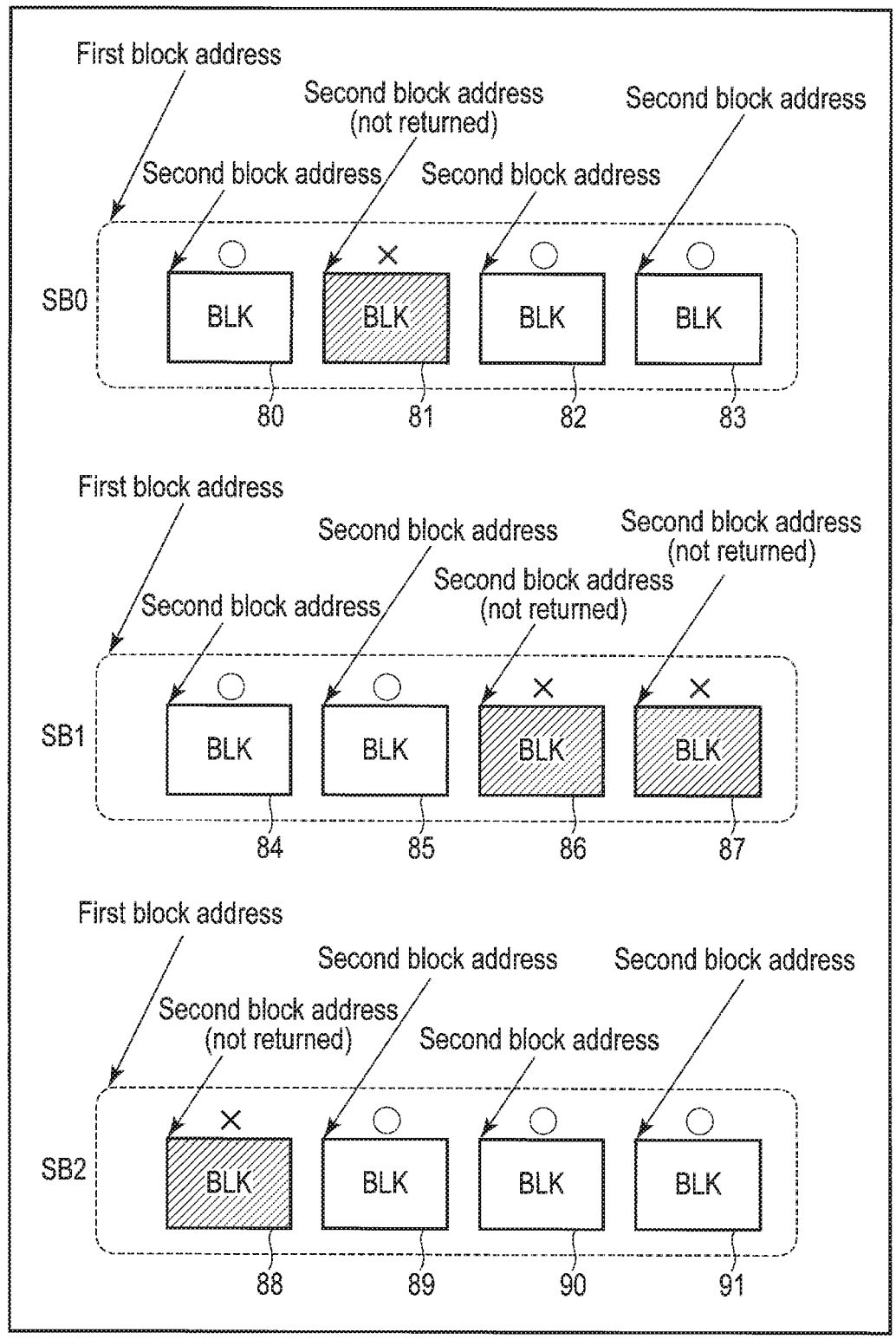
FIG. 16 is a diagram for explanation of a relationship between the block address of the super block and the block address of each of the blocks included in the super block.

FIG. 16 shows a relationship between a super block address (first block address) of the super block and a block address (second block address) of each of the blocks included the super block.

To simplify the illustration, it is assumed that each of the super blocks SB0, SB1, and SB2 is composed of four blocks.

The super block SB0 includes blocks 80, 81, 82, and 83. Each of the blocks 80, 81, 82, and 83 includes the block address (second block address) defined based on a mathematical rule from the super block address (first block address) of the super block SB0. If the block 81 is a defective block, the data from the host 2 is written to the write destination block selected from the blocks 80, 82, and 83. For this reason, the second block address of the defective block 81 (die identifier of the die to which the defective block 81 belongs) does not return to the host 2.

The super block SB1 includes blocks 84, 85, 86, and 87. Each of the blocks 84, 85, 86, and 87 includes the block address (second block address) defined based on a mathematical rule from the super block address (first block address) of the super block SB1. If the blocks 86 and 87 are defective blocks, the data from the host 2 is written to the write destination block selected from the blocks 84 and 85. For this reason, the second block address of the defective block 86 (die identifier of the die to which the defective block 86 belongs) and the second block address of the defective block 87 (die identifier of the die to which the defective block 87 belongs) do not return to the host 2.

The super block SB2 includes blocks 88, 89, 90, and 91. Each of the blocks 88, 89, 90, and 91 includes the block address (second block address) defined based on a mathematical rule from the super block address (first block address) of the super block SB2. If the block 88 is a defective block, the data from the host 2 is written to the write destination block selected from the blocks 89, 90, and 91. For this reason, the second block address of the defective block 88 (die identifier of the die to which the defective block 88 belongs) does not return to the host 2.

Figure 17:
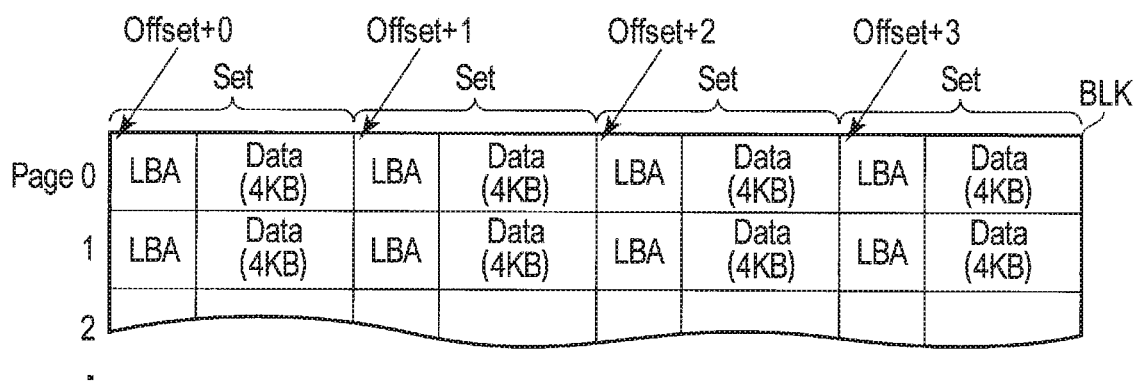
FIG. 17 is a block diagram for explanation of an operation of writing a pair of a logical address and data to a page in a block.
Figure 18:
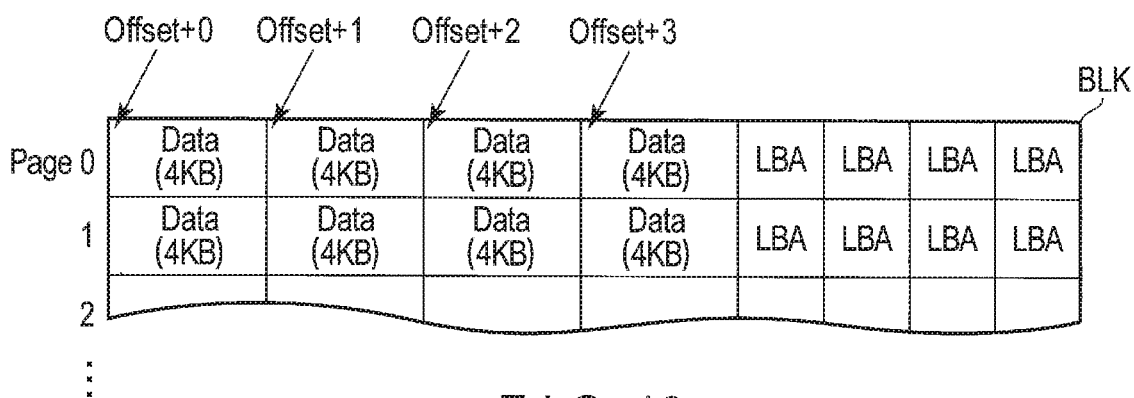
FIG. 18 is a block diagram for explanation of an operation of writing data to a user data region of the page in the block and writing the logical address of the data to a redundant region of the page.

FIG. 17 and FIG. 18 show an operation of writing a pair of the logical address and the data to a page in the block.

In each of the blocks, each page may include a user data area for storing the user data and a redundant region for storing the management data. The page size is over 16 KB.

The controller 4 writes both of 4 KB user data and the logical address (for example, LBA) corresponding to the 4 KB user data to the write destination block BLK. In this case, as shown in FIG. 17, four data sets each including LBA and the 4 KB user data may be written to the same page. The in-block offset may be indicative of the set boundary.

Alternatively, as shown in FIG. 18, four 4 KB user data may be written to user data region in the page and four LBAs corresponding to these 4 KB user data may be written to the redundant region in this page.

An operation of writing plural data portions and an erasure code calculated from these data portions to the super block having a defective block will be explained with reference to FIG. 19.

Figure 19:
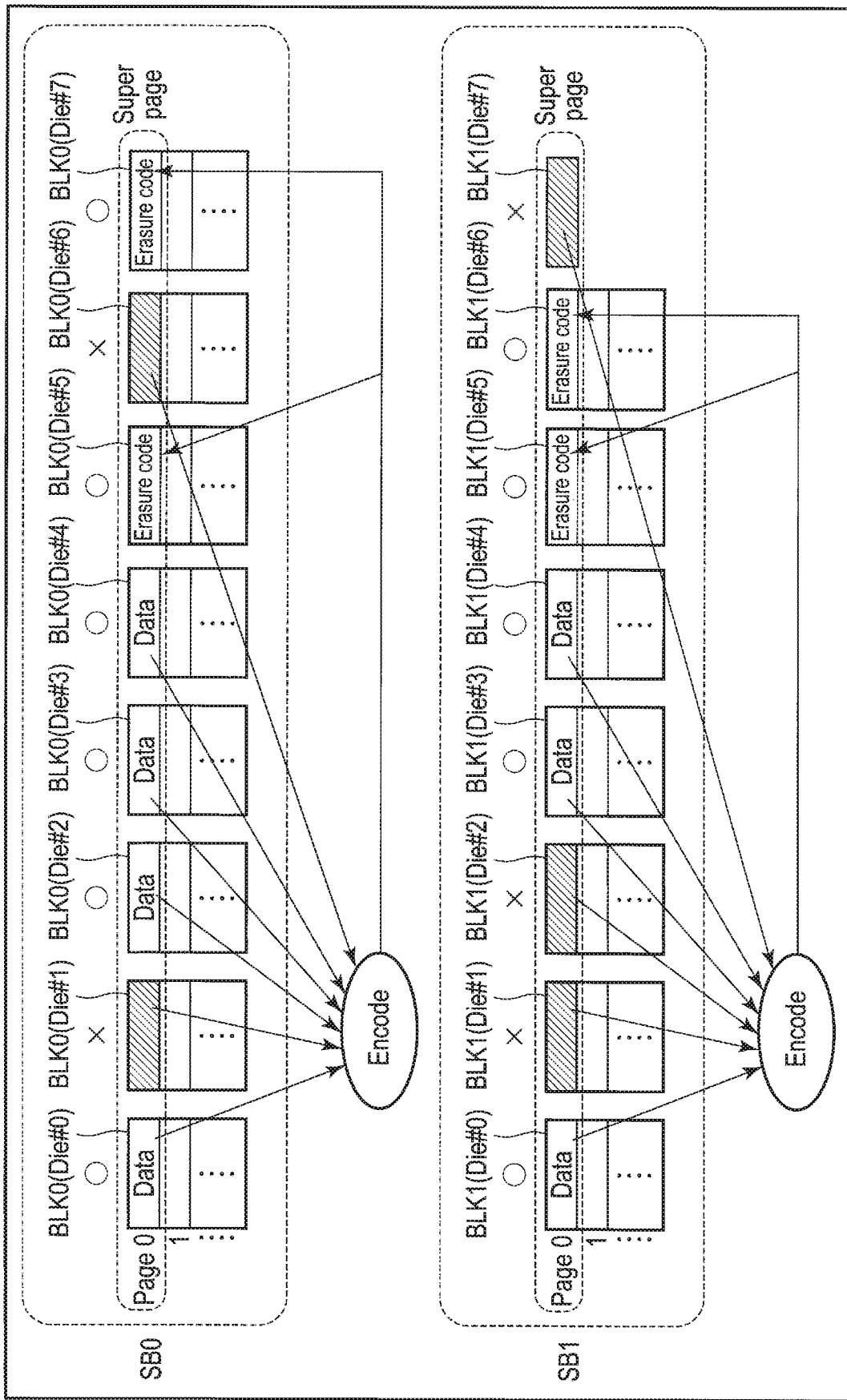
FIG. 19 is a diagram for explanation of writing plural data portions and an erasure code calculated from the data portions to the super block having a defective block.

To implement RAID system with the plural blocks in the super block, the controller 4 writes plural data portions and one or more erasure codes calculated from the plural data portions, across the plural pages belonging to the plural blocks included one super block and having the same page address, as shown in FIG. 19. The plural pages belonging to the plural blocks and having the same page address are referred to as a super page.

It is illustrated in an upper part of FIG. 19 that the data and the erasure codes are written in the super page in the super block SB0. The super page is composed of page 0 of block BLK0 (Die #0), page 0 of block BLK0 (Die #1), page 0 of block BLK0 (Die #2), page 0 of block BLK0 (Die #3), page 0 of block BLK0 (Die #4), page 0 of block BLK0 (Die #5), page 0 of block BLK0 (Die #6), and page 0 of block BLK0 (Die #7).

The data is written to each of the undefective blocks, i.e., BLK0 (Die #0), BLK0 (Die #2), BLK0 (Die #3), and that BLK0 (Die #4).

An example of the erasure code includes Reed-Solomon code, parity, and the like. The erasure codes are written to the pages in the undefective blocks. In addition, the erasure code is calculated by assuming that a predetermined value (for example, a bit string of all "0" or a bit string of all "1") is stored in a page of each defective block.

In the example shown in the upper part of FIG. 19, two erasure codes are written to the super page of the super block SB0. Two erasure codes are written to the pages in two last undefective blocks. In the example shown in the upper part of FIG. 19, since the last block BLK0 (Die #7) is the undefective block, the second last block BLK0 (Die #6) is the defective block, and the third last block BLK0 (Die #5) is the undefective block, two erasure codes are written to page 0 of block BLK0 (Die #5) and page 0 of block BLK0 (Die #7).

In the encoding, the controller 4 calculates two erasure codes, based on the data portion written to BLK0 (Die #0), a predetermined value (for example, a bit string of all "0" or a bit string of all "1") assumed to be written to the defective block BLK0 (Die #0), the data portion written to BLK0 (Die #2), the data portion written to BLK0 (Die #3), the data portion written to BLK0 (Die #4), and a predetermined value (for example, a bit string of all "0" or a bit string of all "1") assumed to be written to the defective block BLK0 (Die #6).

The erasure codes can be thereby easily calculated by the same operation for encoding, irrespective of the pattern of defective blocks/undefective blocks in the super block.

In addition, the controller 4 executes decoding using the erasure codes by assuming that predetermined values are stored in the pages of the respective defective blocks.

In the example shown in the lower part of FIG. 19, since the last block constituting the super block SB1, i.e., BLK1 (Die #7) is the defective block, the second last block BLK1 (Die #6) is the defective block, and the third last block BLK1 (Die #5) is the undefective block, two erasure codes are written to page 0 of block BLK1 (Die #5) and page 0 of block BLK1 (Die #6).

Figure 20:
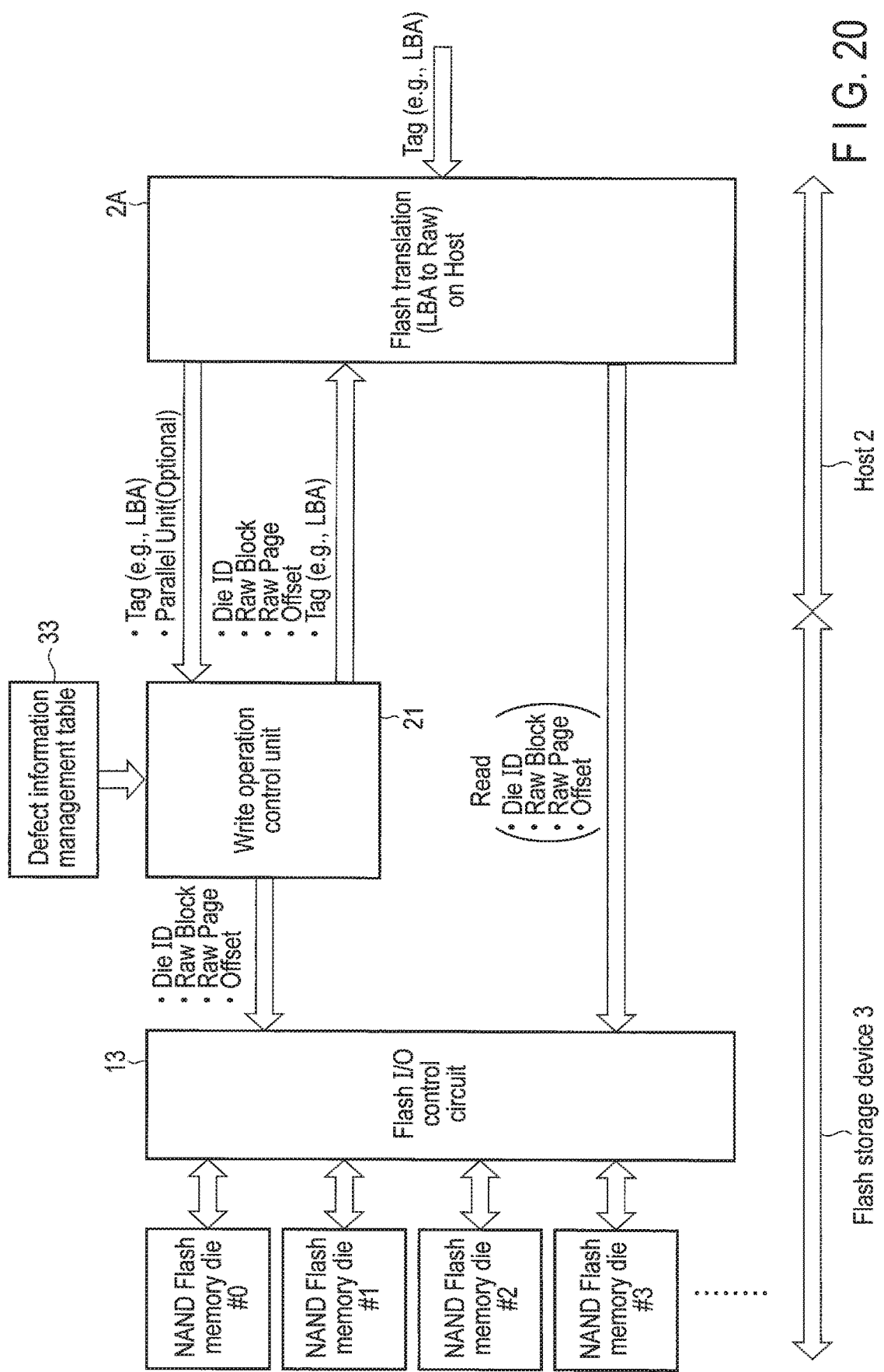
FIG. 20 is a block diagram showing a relationship between a flash translation unit in the host and a write operation control unit in the flash storage device.

Next, a relationship between a flash translation unit 2A in the host 2 and the write operation control unit 21 in the flash storage device 3 will be explained with reference to FIG. 20.

On the host 2 side, if the flash translation unit 2A executes data write, the flash translation unit 2A transmits to the flash storage device 3 a write command including Tag (for example, LBA) identifying the data. In a case where the flash translation unit 2A uses API for super block, the flash translation unit 2A transmits to the flash storage device 3 the write command (Write without Page Address) designating the Tag (for example, LBA) identifying the data, and the block address of the parallel unit. Since the parallel unit is implemented by one super block, the block address of the parallel unit is the super block address of this super block.

The flash storage device 3 includes the write operation control unit 21, the flash I/O control circuit 13, the defect information management table 33, and the NAND flash memory dies. In the defect information management table 33, the defect information holding at least 1-bit information indicative of being available or unavailable for each block in each super block is managed.

If the write operation control unit 21 receives from the host 2 side the write request including Tag (for example, LBA) to identify the data to be written, the write operation control unit 21 selects one block from the undefective blocks included in one super block as the write destination block, by referring to the defect information of the defect information management table 33, and determines the write destination location (write destination page, offset in this page) in the selected block to which the data should be written.

If the write operation control unit 21 receives from the host 2 the write command designating the block address (super block address) of the parallel unit, the write operation control unit 21 selects the write destination block from the undefective blocks included in the super block having the designated block address (super block address), and determines the write destination location (write destination page, offset in this page) in the selected block to which the data should be written.

Then, the write operation control unit 21 transmits to the flash I/O control circuit 13 a write instruction designating the die identifier (Die ID) of the die to which the write destination block belongs, the block address (Raw Block) of the write destination block, the write destination page (Raw Page), and the offset (Offset) in the write destination page.

In addition, the write operation control unit 21 notifies the host 2 of the flash addresses (Die ID, Raw Block, Raw Page, Offset) indicative of both of the write destination block and the write destination location, and Tag (for example, LBA).

The flash I/O control circuit 13 having received the write instruction writes the data to the write destination location, based on the write instruction.

On the host 2 side, when the flash translation unit 2A receives the flash addresses (Die ID, Raw Block, Raw Page, Offset) and Tag (for example, LBA) from the flash storage device 3, the flash translation unit 2A updates LUT managed by the host 2. At this time, the flash addresses (Die ID, Raw Block, Raw Page, Offset) are associated with this Tag (for example, LBA).

When the flash translation unit 2A makes the read request, the flash translation unit 2A transmits the read request designating the flash addresses (Die ID, Raw Block, Raw Page, Offset) to the flash storage device 3.

On the flash storage device 3 side, when the flash I/O control circuit 13 receives the read request designating the flash addresses (Die ID, Raw Block, Raw Page, Offset) from the host 2, the flash I/O control circuit 13 reads the data, based on the flash addresses. The block to be read is specified by Die ID and Raw Block. The page to be read is specified by Paw Page. The location to be read in the page to be read is specified by Offset.

Next, the write operation and the read operation executed by the host 2 and the flash storage device 3 will be explained with reference to FIG. 21.

<Write Operation>
(1) Reception of Write Command
In the flash storage device 3, the write command including LBA and the data which are received from the host 2 are temporarily stored in the write buffer 31 in the flash storage device 3.

(2) Reference of Defective Information
The write operation control unit 21 selects one block from the undefective blocks included in the super block to be written as the write destination block, by referring to the defect information managed by the defect information management table 33, and determines the write destination location in the write destination block.

(3) Instruction to Write
When the write operation control unit 21 determines the write destination block and the write destination location in the write destination block, the write operation control unit 21 transmits the write instruction of designating the flash address (Raw address) indicative of both of the write destination block and the write destination block to the flash I/O control circuit 13 via the write buffer 31. Die ID, Raw Block, Raw Page, and Offset are included in the Raw address. The flash I/O control circuit 13 having received the Raw address writes the write data to the write destination location in the block selected as the write destination block.

(4) Notifying Host of Write Destination
The write operation control unit 21 notifies the host 2 of the Raw address and LBA. The host 2 can thereby update LUT and map this Raw address to the LBA.

<Read Operation>
(11) Notifying LBA
When a read parser 2B receives the read command including LBA, the read parser 2B notifies the flash translation unit 2A of the LBA.

(12) Obtaining Raw Address
When the flash translation unit 2A receives the LBA from the read parser 2B, the flash translation unit 2A obtains the Raw address corresponding to the received LBA and returns the obtained Raw address to the read parser 2B. Thus, the read parser 2B can obtain the Raw address and translate the read command including the LBA into the read command including the Raw address.

(13) Read Instruction
The read parser 2B transmits the read command including the Raw address to the flash storage device 3. In the flash storage device 3, the flash I/O control circuit 13 having received the read command including the Raw address reads the data, based on the Raw address, and transmits the read data to the read buffer 30. The read data is temporarily stored in the read buffer 30.

(14) Transmission of Read Data to Host
The read data temporarily stored in the read buffer 30 is transmitted to the host 2.

Figure 22:
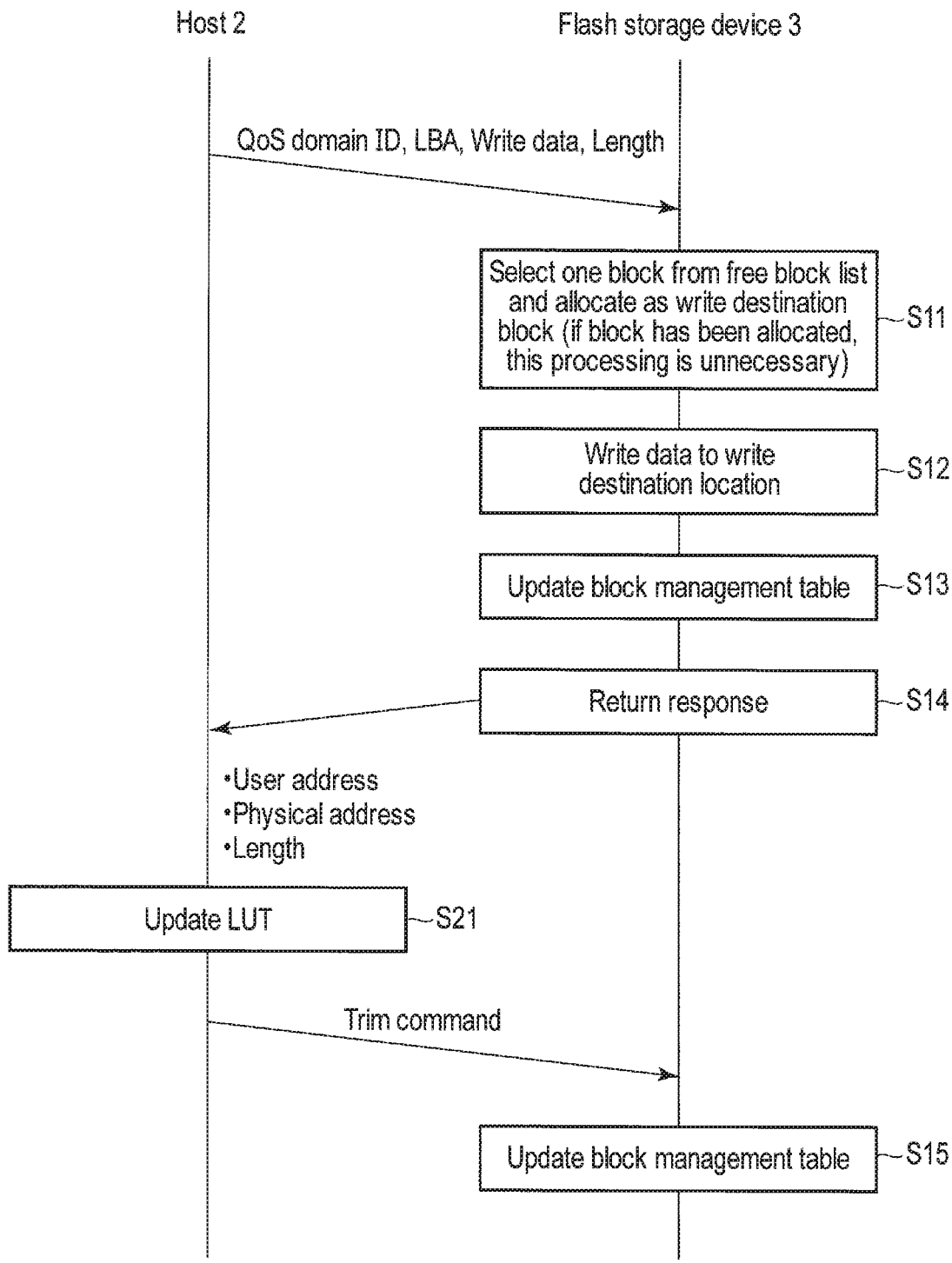
FIG. 22 is a sequence chart showing a sequence of write operation processing executed by the host and the flash storage device.

A sequence chart of FIG. 22 shows steps of the write operation executed by the host 2 and the flash storage device 3.

The host 2 transmits the write command (Write without Physical Address) including the QoS domain ID, the user address (logical address), write data, and the length to the flash storage device 3. When the controller 4 of the flash storage device 3 receives this write command, the controller 4 selects one block from the undefective blocks included in one super block (super block to be written) and determines the write destination location in the selected block (step S11). In step S11, the super block to be written may be a super block belonging to the QoS domain specified by the QoS domain ID. If plural super blocks belong to the QoS domain, one of the plural super blocks is selected as the super block to be written.

The controller 4 writes the write data received from the host 2 to the write destination location (step S12). In step S12, the controller 4 writes both of the user address (for example, LBA) and the write data to the write destination location in the write destination block.

Figures 23, 24:
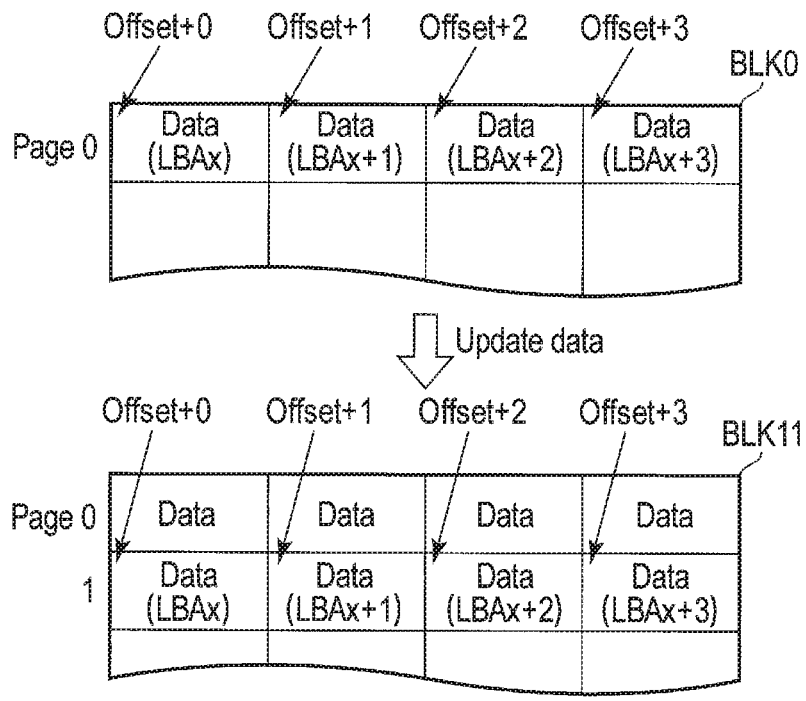
FIG. 23 is a block diagram showing a data update operation of writing update data for already written data.
FIG. 24 is a diagram for explanation of an operation of updating a block management table managed by the flash storage device.

The controller 4 updates the block management table 32, and changes a bit map flag corresponding to the written data (i.e., a bit map flag corresponding to the physical address of the physical location to which the data has been written) from 0 to 1 (step S13). It is assumed that as shown in FIG. 23, for example, 16K-byte update data in which start LBA is LBAx are written to the physical locations corresponding to offsets+0 to +3 of page 1 of block BLK #11. In this case, as shown in FIG. 24, each of the bit map flags corresponding to offsets+0 to +3 of page 1 is changed from 0 to 1 in the block management table for block BLK11.

The controller 4 returns a response to the write command to the host 2 (step S14). The user address, the physical address (flash address), and the length are included in the response. For example, as shown in FIG. 23, if the 16K-byte update data in which starting LBA is LBAx are written to the physical storage locations corresponding to offsets+0 to +3 of page 1 of block BLK11, the response including LBAx, the flash addresses (die identifier of the die to which block BLK 11 belongs, the block address of block BLK11, page address (=1), and in-page offset (=+0)), and the length (=4)) is transmitted from the controller 4 to the host 2. The flash address is represented by a combination of the die identifier, the block address, the page address, and the in-page offset but, in the following explanations, explanation of the die identifier in the flash address will be omitted to simplify the explanation of the flash address.

When the host 2 receives this response, the host 2 updates LUT managed by the host 2 and maps the flash address (physical address) to each of the user addresses corresponding to the written write data. As shown in FIG. 25, LUT includes plural entries corresponding to the respective user addresses (logical addresses). In an entry corresponding to a certain user address (for example, certain LBA), the physical address indicative of the location (physical storage location) in the NAND flash memory 5 in which the data corresponding to the LBA is stored is stored. As shown in FIG. 23, if the 16K-byte update data in which starting LBA is LBAx are written to the physical storage locations corresponding to offsets+0 to +3 of page 1 of block BLK11, the LUT is updated, BLK11, page 1, and offset+0 are stored in the entry corresponding to LBAx, BLK11, page 1, and offset+1 are stored in the entry corresponding to LBAx+1, BLK11, page 1, and offset+2 are stored in the entry corresponding to LBAx+2, and BLK11, page 1, and offset+3 are stored in the entry corresponding to LBAx+3 as shown in FIG. 25.

The host 2 then transmits the Trim command to invalidate previous data which become unnecessary due to write of the above update data, to the flash storage device 3. As shown in FIG. 23, if the previous data are stored in the locations corresponding to offset+0, offset+1, offset+2, and offset+3 of page 0 of block BLK0, the Trim command designating the flash addresses (block address (=BLK0), the page address (=page 0), and in-page offset (=+0)), and the length (=4)) is transmitted from the host 2 to the flash storage device 3 as shown in FIG. 26. The controller 4 of the flash storage device 3 updates the block management table 32 in response to the Trim command (step S15). In step S15, as shown in FIG. 26, each of the bit map flags corresponding to offsets+0 to +3 of page 0 is changed from 1 to 0 in the block management table for block BLK #0.

FIG. 27 shows the read command (Read with Physical Address) applied to the flash storage device 3.

The read command is a command to request the flash storage device 3 to read the data. The read command includes the command ID, the flash address, the length, and the transfer destination pointer.

The command ID is an ID (command code) indicating that this command is the read command, and the command ID for the read command is included in the read command.

The flash address is indicative of a flash address (physical address) of a first physical storage location from which the data should be read. The length is indicative of the length of the data to be read.

The transfer destination pointer is indicative of the location on the memory in the host 2 to which the read data is to be transferred.

One read command can designate plural sets of the flash addresses (physical addresses) and the lengths.

In other word, the read command may include two or more sets of the flash addresses and the lengths. As an example case where the read command includes two or more sets of the flash addresses and the lengths, it is assumed a case that the write data is written to two blocks that sandwich the defective block since the defective block exists in the super block where data write has been executed.

FIG. 28 shows a read operation.

It is assumed here that the read command designating the block address (=BLK2), the page address (=page 1), the in-page offset (=+1), and the length (=3) is received from the host 2. The controller 4 of the flash storage device 3 reads data d1 to d3 from BLK2, based on the block address (=BLK2), the page address (=page 1), the in-page offset (=+1), and the length (=3). In this case, the controller 4 reads the data for one page size from page 1 of BLK2 and extracts data d1 to data d3 from the read data. Next, the controller 4 transfers data d1 to data d3 on a host memory designated by a transfer destination pointer.

Figures 29, 30:
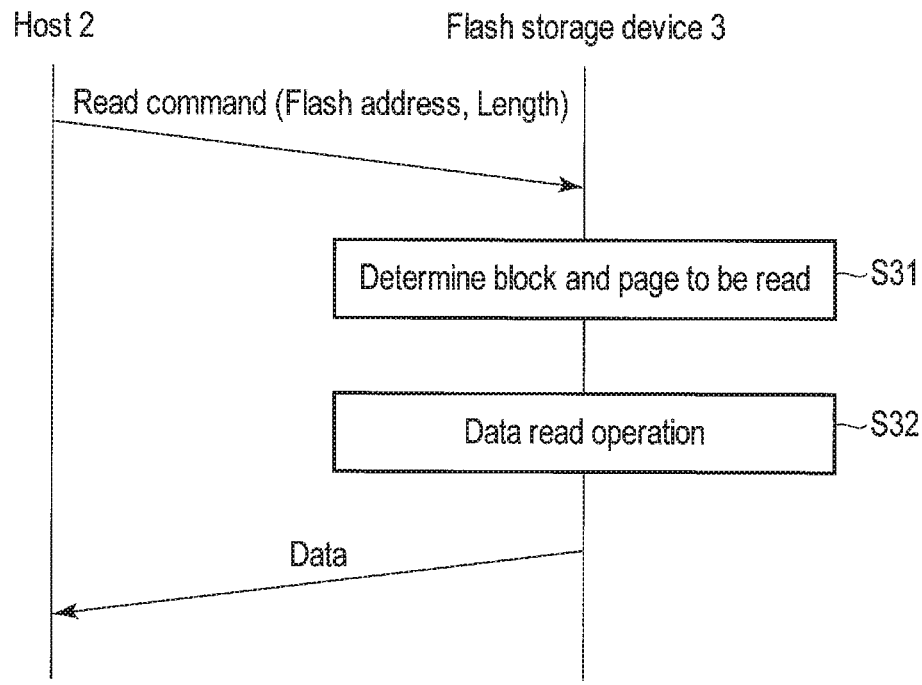
FIG. 29 is a sequence chart showing a sequence of read processing executed by the host and the flash storage device.
FIG. 30 is a table for explanation of a garbage collection (GC) control command applied to the flash storage device.

A sequence chart of FIG. 29 shows steps of the read operation executed by the host 2 and the flash storage device 3.

The host 2 translates the user address (logical address) included in the read request from the user application into the flash address, by referring to LUT managed by the host 2. Then, the host 2 transmits the read command designating the flash address and the length to the flash storage device 3.

When the controller 4 of the flash storage device 3 receives the read command from the host 2, the controller 4 determines the block to be read, the page to be read, and the in-page location to be read, based on the flash address designated by the read command (step S31). The controller 4 reads the data defined by the flash address and the length from the NAND flash memory 5 (step S32) and transmits the read data to the host 2.

FIG. 30 shows a garbage collection (GC) control command applied to the flash storage device 3.

The GC control command may include the command ID, the policy (method of GC), the QoS domain ID, the maximum number of data (maximum-number-of-data), and the like.

The command ID is the ID (command code) indicating that this command is the GC control command, and the command ID for the GC control command is included in the GC control command.

The policy (method of GC) is the policy indicating the condition (GC policy) for selecting the GC candidate block (GC source block). The controller 4 of the flash storage device 3 supports plural GC policies.

The GC policy supported by the controller 4 may include a policy (greedy) that the block of a small valid data amount is selected with priority as the GC candidate block (GC source block).

In addition, the GC policy supported by the controller 4 may include a policy that the block in which data (cold data) of a low update frequency are collected is selected as the GC candidate block (GC source block) with higher priority than the block in which data (hot data) of a high update frequency are collected.

Furthermore, the GC policy may designate the GC start condition. The GC start condition may be indicative of, for example, the number of the remaining free blocks.

The controller 4 manages the super blocks including the valid data by the active block list and, if GC is executed, the controller 4 may select at least one GC candidate super block (GC source block) from the super blocks managed by the active block list, based on the GC policy designated by the GC control command.

The QoS domain ID is a parameter designating the QoS domain where GC should be executed. The controller 4 selects at least one GC candidate super block (GC source block) from the super blocks belonging to the QoS domain designated by the QoS domain ID, i.e., the active block list corresponding to the QoS domain.

The maximum number of data is indicative of the upper limit of the data amount copied in executing the GC. In other words, the GC operation is executed until the amount of the valid data which is copied reaches to the maximum number of data. If the amount of the valid data which is copied reaches to the maximum number of data, the GC operation is stopped.

If the number of remaining free blocks corresponding to the QoS domains is smaller than equal to a threshold value designated by the policy, the controller 4 may start GC.

FIG. 31 shows a forced GC command (Forced Garbage-Collection) applied to the flash storage device 3.

The forced GC command may include the command ID, the QoS domain ID, the super block address, and the like. When the controller receives the forced GC command, the controller executes the GC immediately.

FIG. 32 is shows an address update notification (Address Update Notification (Device Initiated)) transmitted from the flash storage device 3 to the host 2.

The address update notification is executed to notify the host 2 of the storage location of the data which have been changed by executing the GC operation in the flash storage device 3. The address update notification may include the user address, the previous flash address, the new flash address, the reference count, the length, and the like.

The user address is an address for identifying the copied data.

The previous flash address is indicative of a physical address (previous physical address) of the previous physical storage location where the copied data are stored.

The new flash address is indicative of a physical address (new physical address) of the new physical storage location where the copied data are stored.

The reference count is indicative of the number of user addresses referring to the copied data.

The length is indicative of the length of the copied data.

Figure 33:
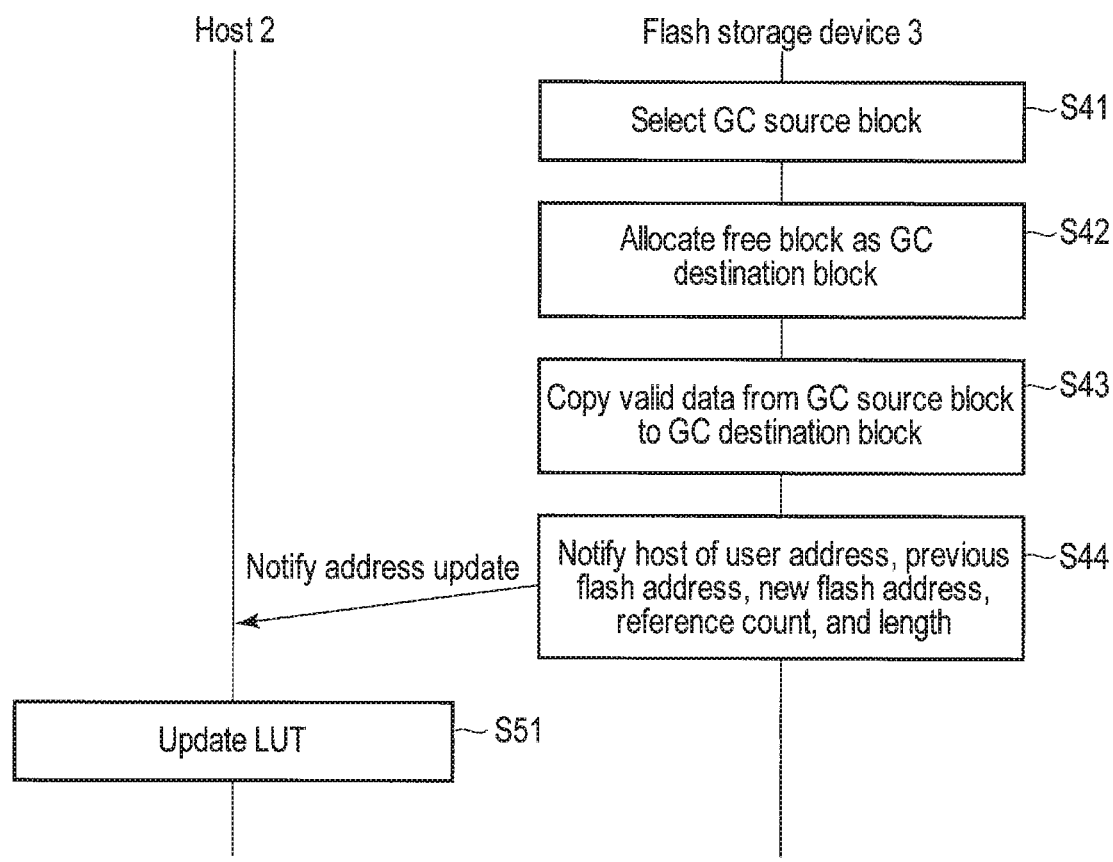
FIG. 33 is a sequence chart showing a procedure of the garbage collection (GC) operation executed by the flash storage device.

A sequence chart of FIG. 33 shows steps of the GC operation executed by the flash storage device 3.

The controller 4 of the flash storage device 3 selects one or more GC source blocks (GC source super blocks) where the valid data and invalid data exist together, from the super blocks belonging to the QoS domain designated by the host 2 (step S41). Next, the controller 4 selects one or more free blocks (free super blocks) from the free blocks (free super blocks) belonging to the QoS domain, and allocates the selected free block as the GC destination block (GC destination super block) (step S42).

The controller 4 copies all of the valid data in the GC source block (GC source super block) to the GC destination block (GC destination super block) (step S43). In step S43, the controller 4 does not copy only the valid data in the GC source block (GC source super block), but copies both of the valid data and the user address (logical address) corresponding to the valid data from the GC source block (GC source super block) to the GC destination block (GC destination super block). A pair of the data and the user address (logical address) can be thereby held in the GC destination block (GC destination super block).

Then, the controller 4 notifies the host 2 of the user address (logical address), the previous flash address, the new flash address, and the length for each copied valid data, by using the address update notification (step S44).

When the host 2 receives the address update notification, the host 2 updates LUT managed by the host 2 and maps the new flash address to the user address (logical address) corresponding to each copied valid data (step S51).

Figure 34:
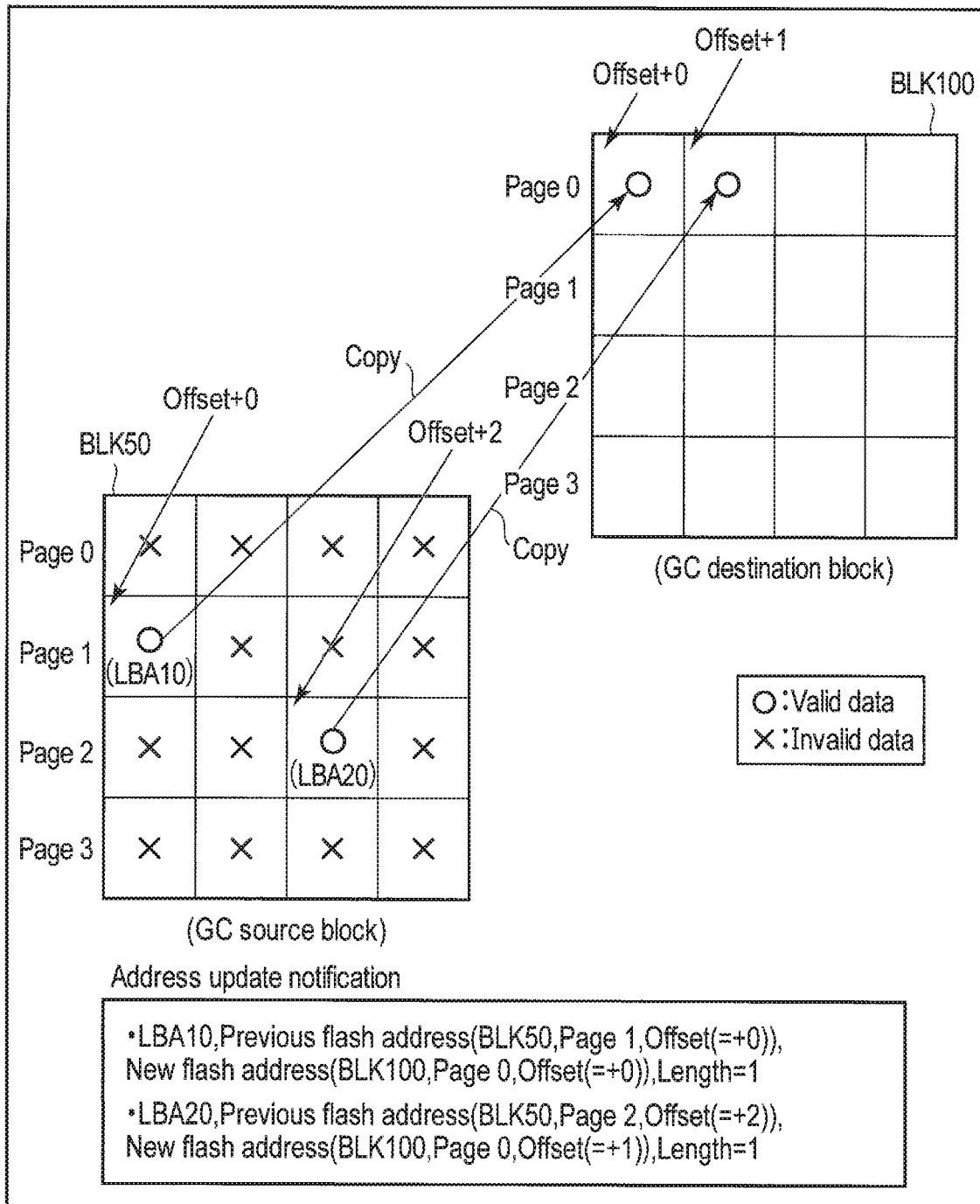
FIG. 34 is a diagram for explanation of an example of a data copy operation executed for the garbage collection (GC).

FIG. 34 shows an example of a data copy operation executed for GC.

In FIG. 34, it is assumed that the valid data (LBA=10) stored in the location corresponding to offset +0 of page 1 of the GC source block (block BLK50 in this case) is copied to the location corresponding to offset+0 of page 0 of the GC destination block (block BLK100 in this case) and that the valid data (LBA=20) stored in the location corresponding to offset+2 of page 2 of the GC source block (block BLK50) is copied to the location corresponding to offset +1 of page 0 of the GC destination block (block BLK100 in this case). In this case, the controller 4 notifies the host 2 of {LBA10, previous flash address (BLK50, page 1, offset (=+0)), new flash address (LBA100, page 0, offset (=+0)), length (=1)} and {LBA20, previous flash address (BLK50, page 2, offset (=+2)), new flash address (LBA100, page 0, offset (=+1)), length (=1)} (address update notification).

Figure 35:
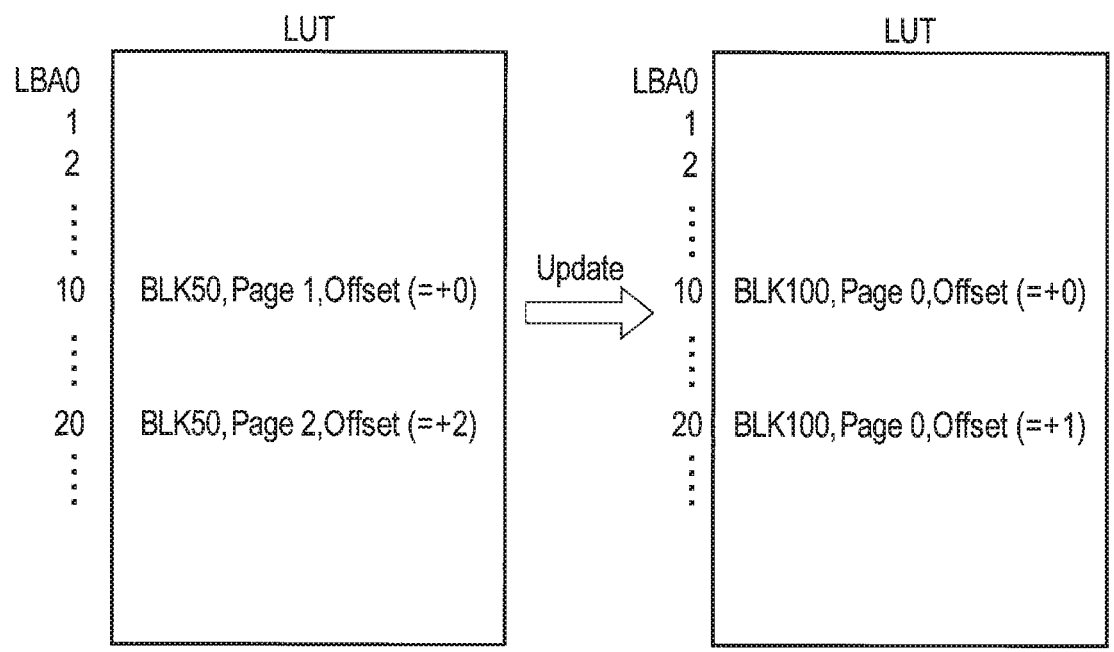
FIG. 35 is an illustration for explanation of contents of a lookup table of the host updated based on a result of the data copy operation shown in FIG. 34.

FIG. 35 shows contents of LUT 411 of the host 2 updated based on a result of the data copy operation shown in FIG. 34.

In the LUT, the flash address (block address, page address, and offset (in-page offset)) corresponding to LBA 10 is updated from BLK50, page 1, and offset (=+0) to BLK100, page 0, and offset (=+0). Similarly, the flash address (block address, page address, and offset (in-page offset)) corresponding to LBA 20 is updated from BLK50, page 2, and offset (=+2) to BLK100, page 0, and offset (=+1).

After LUT is updated, the host 2 may transmit the Trim command designating BLK50, page 1, and offset (=+0) to the flash storage device 3 and invalidate the data stored in the location corresponding to offset (=+0) of page 1 of BLK50. Furthermore, the host 2 may transmit the Trim command designating BLK50, page 2, and offset (=+2) to the flash storage device 3 and invalidate the data stored in the location corresponding to offset (=+2) of page 2 of BLK50.

FIG. 36 shows a relationship between the response to the write command and the callback processing for GC (address update notification).

During a time period in which the controller 4 is copying the valid data corresponding to a certain user address (logical address), the write command designating this user address may be received from the host 2.

In FIG. 36, it is assumed that the write command designating LBA10 is received from the host 2 during execution of the data copy operation (data copy operation corresponding to LBA10) shown in FIG. 34.

The controller 4 writes the write data received from the host 2 to the write destination block (i.e., to the location corresponding to offset+0 of page 0 of BLK3). Then, the controller 4 returns {LBA10, BLK3, page 0, offset (=+0)} to the host 2 as the response to the write command.

The host 2 updates the LUT, and changes the block address, the page address, and the offset (in-page offset) corresponding to LBA 10 from BLK50, page 1, and offset (=+0) to BLK3, page 0, and offset (=+0).

After this, if the controller 4 notifies the host 2 of the new flash address corresponding to LBA 10, the latest flash address (BLK3, page 0, and offset (+0)) indicative of the location where the latest data corresponding to LBA 10 is stored may be erroneously changed to the new flash address (BLK100, page 0, and offset (+0) in this case) corresponding to LBA 10.

In the present embodiments, the controller 4 can notify the host 2 of not only LBA 10 and the new flash address (BLK100, page 0, and offset (+0)) and the length=1), but also the previous flash address (BLK50, page 1, and offset (+0)) (address update notification). If the previous flash address (BLK50, page 1, and offset (+0)) does not match the block address, the page address, and the offset currently mapped to LBA 10 by LUT, the host 2 does not update LUT. The block address, the page address, and the offset (BLK3, page 0, and offset (+0)) indicative of the location where the latest data corresponding to LBA 10 is stored can be thereby prevented from being erroneously changed to the new flash address (BLK100, page 0, and offset (+0) in this case) corresponding to LBA 10.

A flowchart of FIG. 37 shows steps of the LUT update processing executed by the host 2.

If the host 2 receives the address update notification (YES in step S101), the host 2 compares the previous flash address with the current physical address on the LUT (step S102). If the previous flash address matches the current physical address as a result of comparison (YES in step S103), the host 2 updates the current physical address corresponding to the user address to the new flash address (step S104). Next, the host 2 transmits the Trim command to the flash storage device and invalidates the data stored in the location corresponding to the previous flash address (step S105).

In contrast, if the previous flash address does not match the current physical address (NO in step S106), the host 2 maintains the current physical address corresponding to the user address (step S106). The block address, the page address, and the offset indicative of the location where the latest data is stored can be thereby prevented from being erroneously changed to the new flash address.

An example of the block management table for block BLK1 is shown in FIG. 38.

The block management table for block BLK1 includes plural entries corresponding to respective sets of the page addresses and in-page offsets of block BLK1.

For example, the reference count corresponding to 4 KB data stored in the location corresponding to page 0 of block BLK1 and offset+0 of page 0 is stored in the entry corresponding to page 0 and offset+0. Similarly, the reference count corresponding to 4 KB data stored in the location corresponding to page 0 of block BLK1 and offset+1 of page 0 is stored in the entry corresponding to page 0 and offset+1.

Data in which the reference count is 1 or more is valid data, and data in which the reference count is 0 is invalid data.

The flash storage device 3 increments/decrements the reference count, based on the duplicate command/Trim command received from the host 2.

FIG. 39 shows a duplicate command applied to the flash storage device 3 in order to manage the reference count.

The duplicate command is a command to request the flash storage device 3 to increment the reference count of the data stored in a certain physical address (block address, page address, and in-page offset).

The duplicate command may include the command ID, the flash address, the length, and the like.

The command ID is an ID (command code) indicating that this command is the duplicate command, and the command ID for the duplicate command is included in the duplicate command.

The flash address is indicative of a first physical storage location where the data in which the reference count should be incremented is stored.

The length is indicative of the length of the data in which the reference count should be incremented.

If the controller 4 receives the duplicate command including the block address, the page address, and the in-page offset indicative of the physical location where the data in which the reference count should be incremented is stored, from the host 2, the controller 4 updates the block management table 32, and increments the reference count corresponding to the data of the physical location corresponding to the block address, the page address, and the in-page offset included in the duplicate command.

A sequence chart of FIG. 40 shows reference count increment/decrement processing.

When the controller 4 of the flash storage device 3 receives the duplicate command from the host 2, the controller 4 increments the reference count corresponding to the flash address (block address, page address, and offset (in-page offset)) designated by the duplicate command, i.e., the reference count corresponding to the data stored in the physical storage location in the NAND flash memory 5 designated by the block address, the page address, and the offset, by 1 (step S61). In this case, the controller 4 updates the block management table 32 corresponding to the block having the block address designated by the duplicate command. In updating of the block management table 32, the reference count stored in the entry in the block management table 32 corresponding to the physical storage location designated by the duplicate command is incremented by, for example, 1. If the length designated by the duplicate command is 2 or more, not only the reference count corresponding to the page address and the offset designated by the duplicate command, but also the reference counts corresponding to several page addresses and offsets following the page address and the offset are incremented by, for example, 1.

When the controller 4 of the flash storage device 3 receives the Trim command from the host 2, the controller 4 decrements the reference count corresponding to the flash address (block address, page address, and offset (in-page offset)) designated by the Trim command, i.e., the reference count corresponding to the data stored in the physical storage location in the NAND flash memory 5 designated by the block address, the page address, and the offset, by 1 (step S62). In this case, the controller 4 updates the block management table 32 corresponding to the block having the block address designated by the Trim command. In updating of the block management table 32, the reference count stored in the entry in the block management table 32 corresponding to the page address and the offset designated by the Trim command is decremented by, for example, 1. If the length designated by the Trim command is 2 or more, not only the reference count corresponding to the page address and the offset designated by the Trim command, but also the reference counts corresponding to several page addresses and offsets following the offset are decremented by, for example, 1.

In GC, the controller 4 refers to the block management table corresponding to the GC source block and determines whether the data in the GC source block is valid data or invalid data in the data unit having the size of 4 KB. The controller 4 determines that the data in which the reference count is 0 is invalid data and that the data in which the reference count is 1 or more is valid data. Then, the controller 4 copies the valid data (i.e., the data in which the reference count is 1 or more) and the logical address corresponding to the valid data from the GC source block (GC source super block) to the GC destination block (GC destination super block).

More specifically, if the controller 4 executes the garbage collection of the NAND flash memory 5, the controller 4 selects the GC source block (GC source super block) and the GC destination block (GC destination super block) for garbage collection. The controller 4 copies both of the first data (valid data) in which the reference count is 1 or more and the logical address of the first data, which are stored in the GC source block (GC source super block), to the GC destination block (GC destination super block). Then, the controller 4 notifies the host 2 of the user address (logical address) of the first data, the physical address of the copy destination physical storage location (new physical storage location) of the first data, and the physical address of the copy source physical storage location (previous physical storage location) of the first data.

Figure 41:
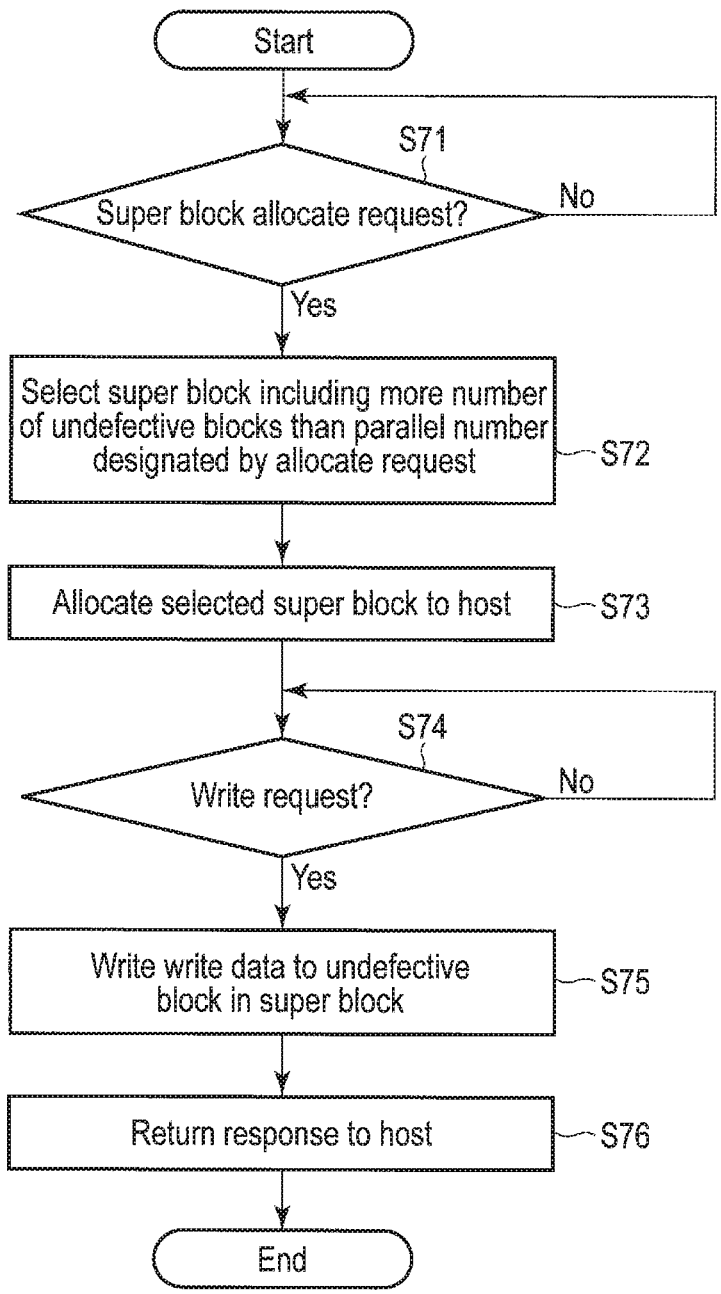
FIG. 41 is a flowchart showing a procedure of super block allocating processing executed by the flash storage device.

A flowchart of FIG. 41 shows steps of the super block allocating processing executed by the flash storage device 3.

If the controller 4 receives a super block allocate request (parallel unit allocate request) from the host 2 (YES in step S71), the controller 4 selects the super block including a more number of undefective blocks than the parallel number designated by the allocate request (step S72).

Next, the controller 4 allocates the selected super block to the host 2 (step S73).

Then, if the controller 4 receives the write request from the host 2 (YES in step S74), the controller 4 writes the write data to the undefective block in the allocated super block (step S75). The controller 4 returns a response to the host 2 (step S76).

Next, an address translating operation of translating an address of the block to be accessed such that all undefective blocks in the super block are logically arranged sequentially from a leading part of the super block will be explained with reference to FIG. 42.

Figure 42:
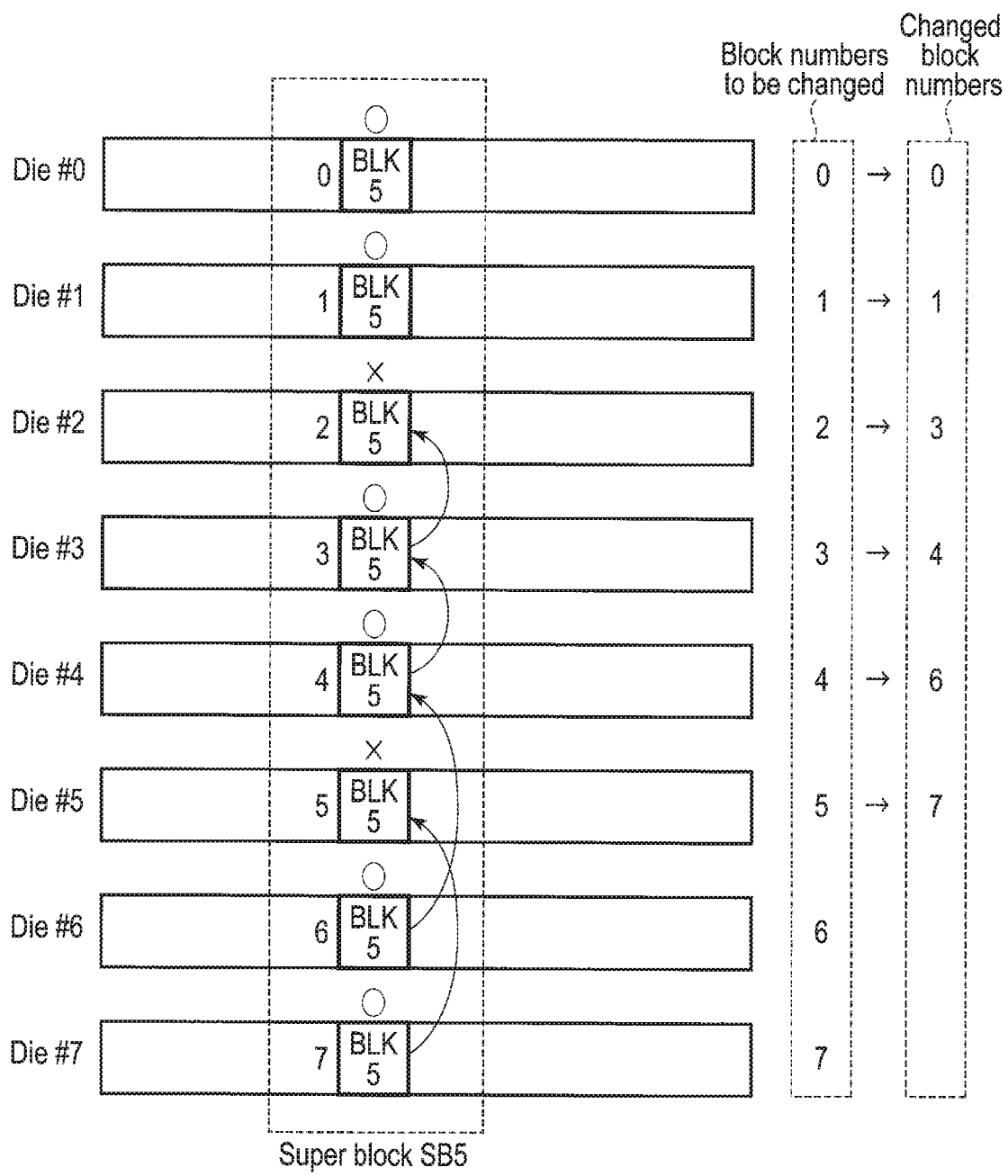
FIG. 42 is a diagram for explanation of an address translating operation of translating an address of the block to be accessed such that all undefective blocks in the super block are logically arranged sequentially from a leading part of the super block.

In FIG. 42, super block SB5 is composed of BLK5 (Die #0), BLK5 (Die #1), BLK5 (Die #2), BLK5 (Die #3), BLK5 (Die #4), BLK5 (Die #5), BLK5 (Die #6), and BLK5 (Die #7), and BLK5 (Die #2) and BLK5 (Die #5) are defective blocks. In addition, it is assumed that BLK5 (Die #0), BLK5 (Die #1), BLK5 (Die #2), BLK5 (Die #3), BLK5 (Die #4), BLK5 (Die #5), BLK5 (Die #6), and BLK5 (Die #7) are designated from the outside by block numbers (block addresses) 0, 1, 2, 3, 4, 5, 6, and 7, respectively.

The address translation is executed such that six undefective blocks in super block SB5, i.e., BLK5 (Die #0), BLK5 (Die #1), BLK5 (Die #3), BLK5 (Die #4), BLK5 (Die #6), and BLK5 (Die #7) are designated from the outside by block numbers (block addresses) 0 to 5, respectively.

If the address translation operation is executed, the block numbers of respective BLK5 (Die #0), BLK5 (Die #1), BLK5 (Die #2), BLK5 (Die #3), and BLK5 (Die #4) are translated in manners of 0→0, 1→1, 2→3, 3→4, 4→6, and 5→7. Including the block numbers of the defective blocks in the sequential offset addresses starting from the leading part of the super block SB5 can be prevented by this address translation operation. Therefore, since all of the undefective blocks in the super block SB5 are logically arranged sequentially from the leading part of the super block SB5 by this address translation operation, the super block SB5 can be handled as if the super block SB5 were a small-size super block including no defective blocks (i.e., a super block composed of six undefective blocks). As a result, even if the data is long, the physical storage location of the data can be expressed by the only combination of one physical address indicative of the starting physical storage location and one length.

Figure 43:
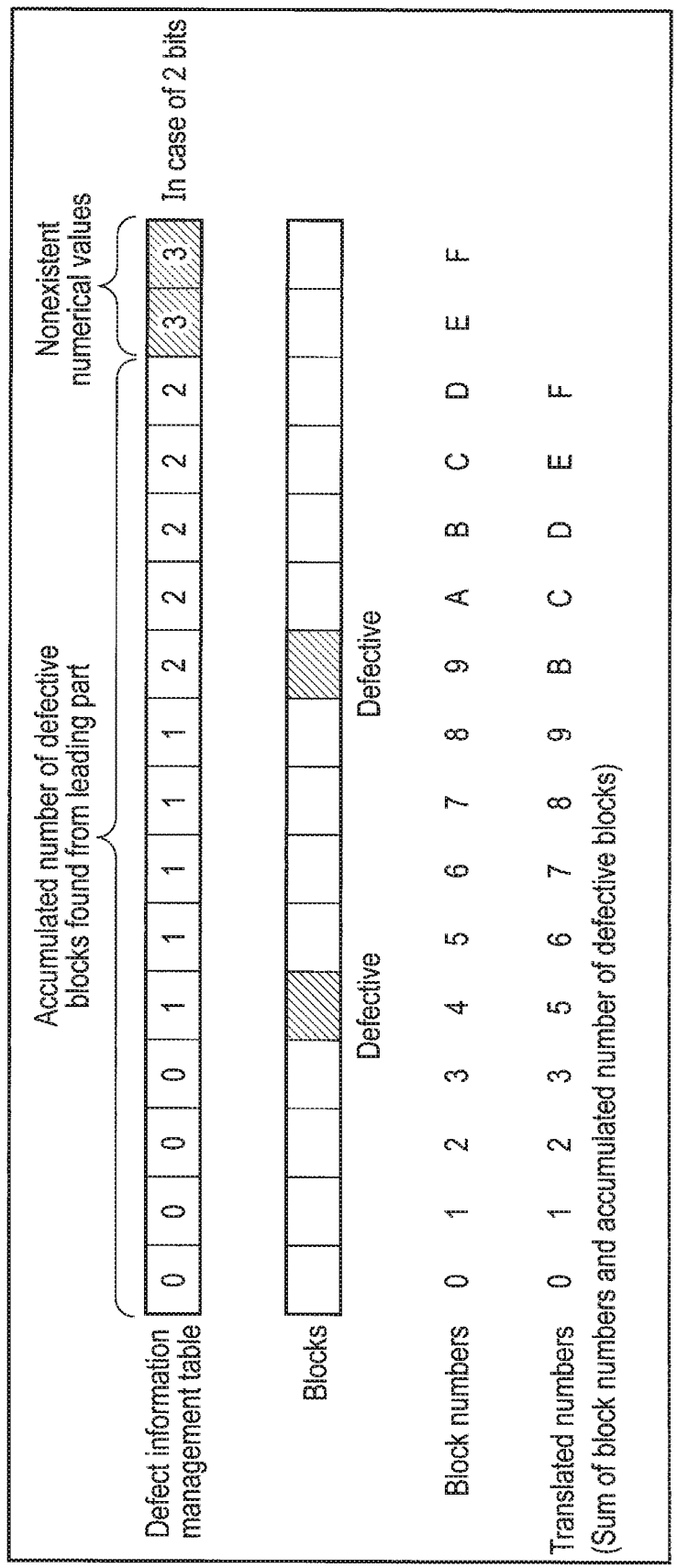
FIG. 43 is a diagram for explanation of an example of the address translation and a defect information management table used for the address translation operation.

Next, an example of the address translation operation and the defect information management table 33 used for the address translation operation will be explained with reference to FIG. 43. In FIG. 43, the block numbers are represented by hexadecimal digits.

The defect information management table 33 is indicative of accumulated number of defective blocks found from the leading part (from block of smallest block number). In FIG. 43, blocks having block numbers 4 and 9 of the defect information management table 33 are defective blocks. In this case, in the defect information management table 33, "0" is stored at a location corresponding to block number 0, a location corresponding to block number 1, a location corresponding to block number 2, and a location corresponding to block number 3, "1" is stored at a location corresponding to block number 4, a location corresponding to block number 5, a location corresponding to block number 6, a location corresponding to block number 7, and a location corresponding to block number 8, and "2" is stored at a location corresponding to block number 9, a location corresponding to block number A, a location corresponding to block number B, a location corresponding to block number C, and a location corresponding to block number D. In other words, the blocks having the block numbers corresponding to the parts where the stored numerical values are changed are indicative of defective blocks.

Nonexistent numerical values are stored at locations corresponding to block numbers E and F of the defect information management table 33. If the bit number of the defect information per block is 2 bits, "3" is stored at the locations corresponding to block numbers E and F.

In addition, if the address translation operation is executed, the block number of the block to be accessed is translated into a sum of the block number of this block and the accumulated number of defective blocks. For example, block numbers 0 to 3 are invariable since the accumulated number of the defective blocks is "0" at the block numbers.

In contrast, for example, if the block number of the block to be accessed is 4, the block number is incremented by +1 and translated into block number "5". For this reason, if the block number of the block to be accessed is 4, the data is actually written to the block having block number "5". The controller 4 notifies the host 2 of block number 4 as the physical address of the write destination block. If the controller 4 receives the read request to designate block number 4 as the physical address of the block to be read, the controller 4 reads the data from the block having block number "5" since block number 4 is translated into block number "5".

Similarly, if the block number of the block to be accessed is 5, the block number is incremented by +1 and translated into block number "6". For this reason, if the block number of the block to be accessed is 5, the data is actually written to the block having block number "6". The controller 4 notifies the host 2 of block number 5 as the physical address of the write destination block. If the controller 4 receives the read request to designate block number 5 as the physical address of the block to be read, the controller 4 reads the data from the block having block number "6" since block number 5 is translated into block number "6".

FIG. 44 shows a relationship between the flash translation unit 2A in the host 2 and the defective block translation unit 24 in the flash storage device 3.

On the host 2 side, if the flash translation unit 2A executes data write, the flash translation unit 2A transmits a write command including Tag (for example, LBA) identifying the data to the flash storage device 3. If the flash translation unit 2A uses API for super block, the flash translation unit 2A transmits to the flash storage device 3 a write command (Write without Page Address) designating the Tag (for example, LBA) identifying the data and the block address of the parallel unit. Since the parallel unit is implemented by one super block, the block address of the parallel unit is the super block address of this super block.

The flash storage device 3 is composed of the defective block translation unit 24, the flash I/O control circuit 13, the defect information management table 33, and the NAND flash memory dies. In addition, the defect information holding at least 2-bit information indicative of being available or unavailable for each block in each super block is managed in the defect information management table 33.

If the defective block translation unit 24 receives from the host 2 side the write request including Tag (for example, LBA) which is the information to identify the data to be written, the defective block translation unit 24 selects the undefective block in the super block to be written as the write destination block and determines the write destination location (write destination page, and offset in this page) in the selected block, by executing the address translation to translate the address of the block to be accessed such that all of the undefective blocks included in the super block to be written are logically arranged sequentially from the leading part of the super block to be written, by referring to the defect information.

If the defective block translation unit 24 receives the write command to designate the block address (super block address) of the parallel unit, the defective block translation unit 24 selects the super block having the designated block address (super block address) as the super block to be written, by referring to the defect information.

Then, the defective block translation unit 24 transmits to the flash I/O control circuit 13 a write instruction designating the die identifier (Die ID) of the die to which the write destination block belongs, the block address (Raw Block) of the write destination block, the write destination page (Raw Page), and the offset (Offset) in the write destination page.

In addition, the defective block translation unit 24 notifies the host 2 of the Tag (for example, LBA) and the physical address indicative of both of the block to be accessed before address translation and the write destination location. The physical address may be represented by the parallel unit indicative of the write destination super block and the offset (Offset) in the super block. The parallel unit indicative of the write destination super block is the super block address of the write destination super block.

The flash I/O control circuit 13 having received the write instruction writes the data to the write destination location, based on the write instruction.

On the host 2 side, if the flash translation unit 2A receives the physical address (Parallel Unit, Offset) and the Tag (for example, LBA), the flash translation unit 2A updates the LUT managed by the host 2 and maps the received physical address to the received Tag (for example, LBA).

When the flash translation unit 2A makes the read request, the flash translation unit 2A transmits the read request designating the physical addresses (Parallel Unit, Offset) to the flash storage device 3.

On the flash storage device 3 side, if the defective block translation unit 24 receives the read request to designate the physical addresses (Parallel Unit, Offset) from the host 2, the defective block translation unit 24 executes the above-explained address translation and translates the physical addresses (Parallel Unit, Offset) into the die identifier (Die ID), the block address (Law Block), the page address (Raw Page), and the offset (Offset) in the page. Then, the defective block translation unit 24 transmits a write instruction designating the die identifier (Die ID), the block address (Raw Block), the page address (Raw Page), and the in-page offset (Offset) to the flash I/O control circuit 13. The flash I/O control circuit 13 reads the data, based on the die identifier (Die ID), the block address (Raw Block), the page address (Raw Page), and the in-page offset (Offset).

FIG. 45 shows a configuration example of the host 2 (computing system).

The host 2 (computing system) comprises a processor (CPU) 101, a main memory 102, a BIOS-ROM 103, a network controller 105, a peripheral interface controller 106, a controller 107, an embedded controller (EC) 108, and the like.

The processor 101 is a CPU configured to control operations of the components of the computing system. The processor 101 executes various programs loaded from one of the plural flash storage devices 3 into the main memory 102. The main memory 102 is composed of a random access memory such as a DRAM. The programs executed by the processor 101 include an application software layer 41, an operating system (OS) 42, a file system 43, a driver 44, and the like. A flash storage manager 45 is included in the file system 43. The flash storage manager 45 may be included in not the file system 43, but the driver 44.

The processor 101 also executes a basic input/output system (BIOS) stored in a BIOS-ROM 103 that is a non-volatile memory. The BIOS is a system program for hardware control.

The network controller 105 is a communication device such as a wired LAN controller, a wireless LAN controller. The peripheral interface controller 106 is configured to communicate with a peripheral device such as a USB device.

The controller 107 is configured to execute communicate with devices connected to plural connectors 107A. The plural flash storage devices 3 may be connected to the respective connectors 107A. The controller 107 is an SAS expander, a PCIe switch, a PCIe expander, a RAID controller, or the like.

The EC 108 functions as a system controller configured to execute power management for the computing system. The EC 108 powers on or powers off the computing system in response to the user operation of the power switch. The EC 108 is implemented as a processing circuit such as a one-chip microcomputer.

The flash storage manager 45 is a program module which functions as the above-explained flash translation unit 2A. The flash storage manager 45 comprises the above-explained LUT which manages mapping between each of the user addresses (logical addresses) and each of the physical addresses of the flash storage device 3. If LBA is used as the user address (logical address), the flash storage manager 45 may be provided in the driver 44.

The flash storage manager 45 transmits to the flash storage device 3 the write command designating the user address (logical address) identifying the data to be written, and the length of the data. The flash storage manager 45 receives from the flash storage device 3 the physical address indicative of both of the write destination block selected from the blocks except the defective block by the flash storage device 3 and the write destination location in the write destination block, and the above-explained user address (logical address), updates LUT, and maps this physical address to the user address (logical address). More specifically, the received physical address is indicative of both of the write destination block selected from the blocks except the defective block included in one parallel unit as the write destination block by the flash storage device 3, and the physical storage location in the write destination block to which the write data is written.

In addition, the flash storage manager 45 obtains the physical address mapped to the user address (logical address) corresponding to the data to be read, by referring to LUT, and transmits the read command designating this physical address to the flash storage device 3.

Figure 46:
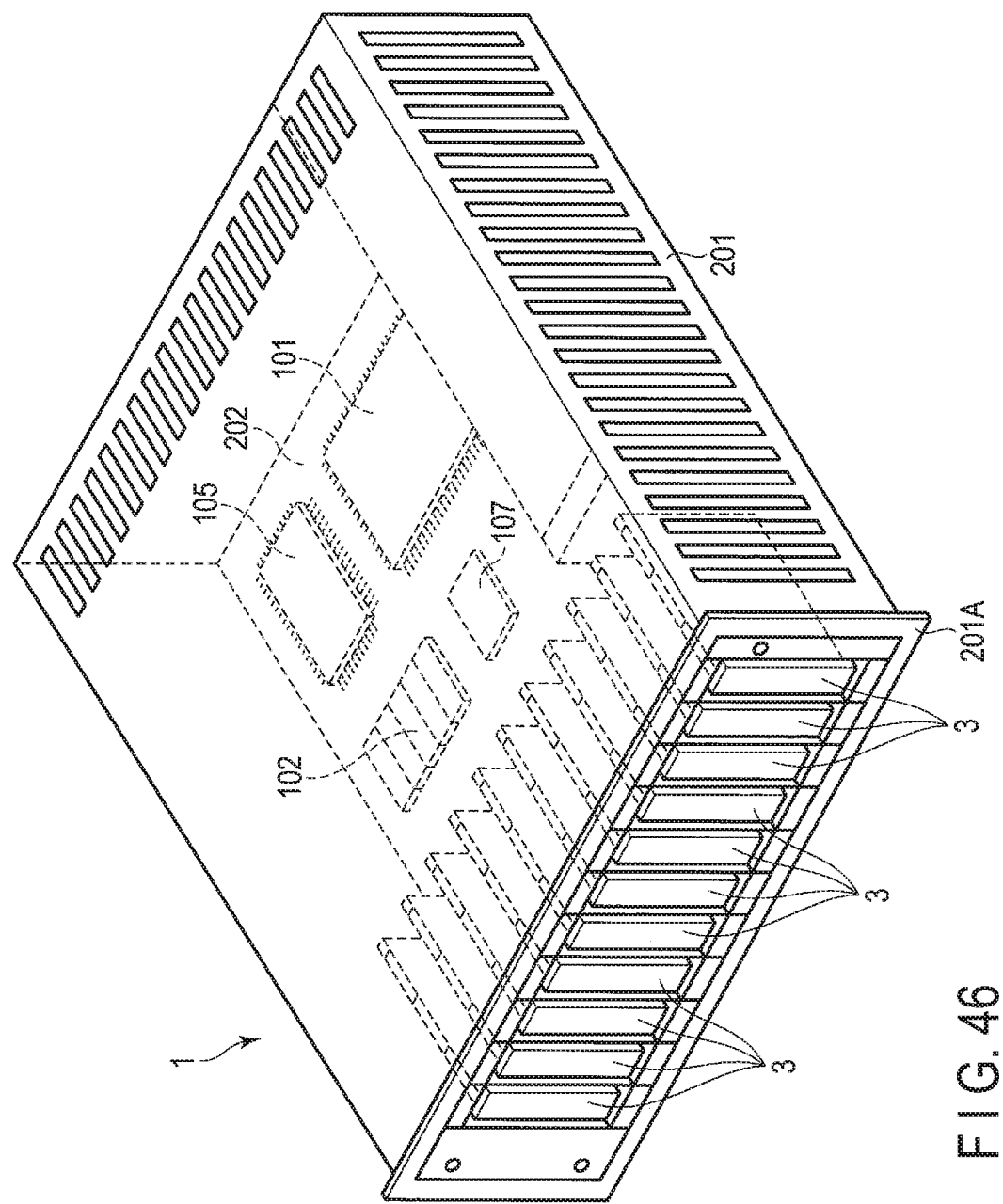
FIG. 46 is a perspective view showing a configuration example of the host built in the flash storage device.

FIG. 46 shows a configuration example of the host (computing system) 2 incorporating the flash storage device 3.

The computing system comprises a thin-box-shaped housing 201 which can be accommodated in a rack. A large number of the flash storage devices 3 may be disposed in the housing 201. In this case, the flash storage devices 3 may be removably inserted into respective slots provided on a front surface 201A of the housing 201.

A system board (motherboard) 202 is disposed in the housing 201. Various electronic components including the CPU 101, the memory 102, the network controller 105, and the controller 107 are mounted on the system board (motherboard) 202. The electronic components function as the host 2.

Figure 47:
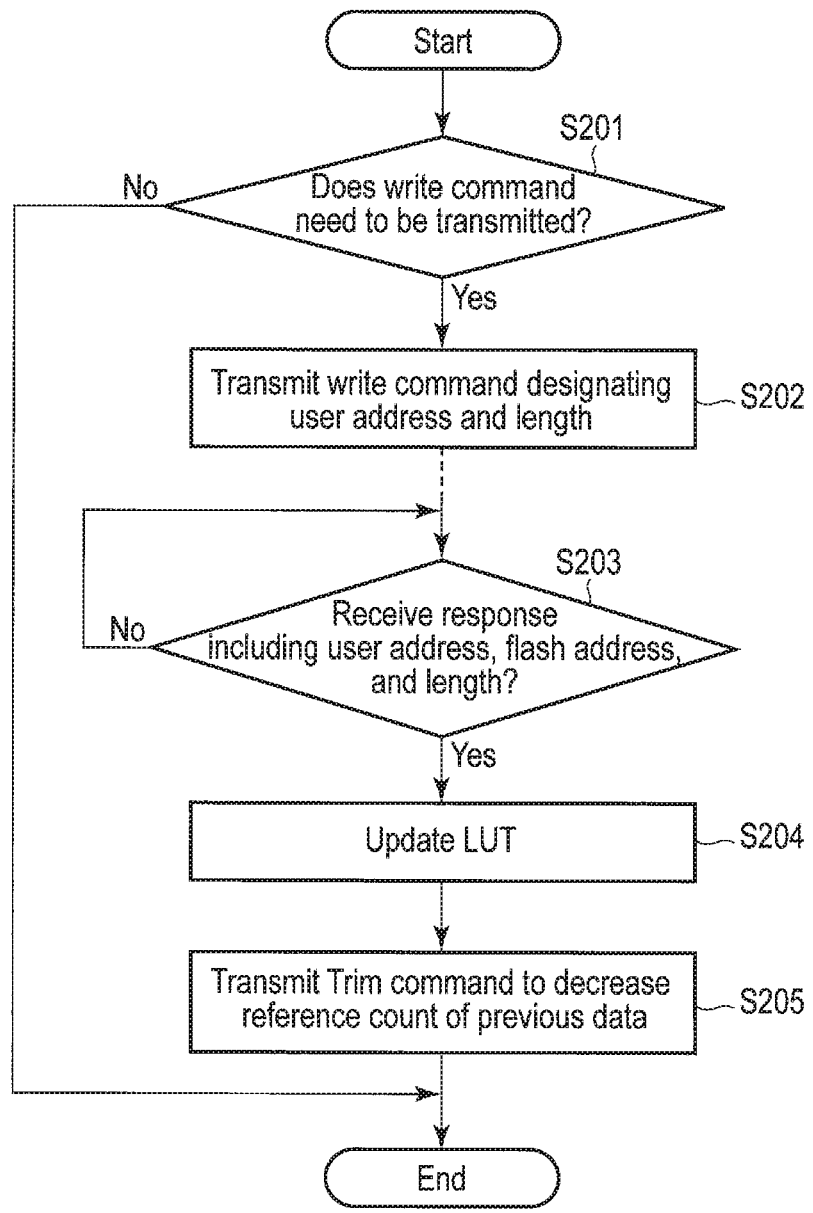
FIG. 47 is a flowchart showing steps of the write operation executed by the host.

A flowchart of FIG. 47 shows steps of the write operation executed by the host (computing system) 2.

The processor 101 of the host 2 executes the following steps by running a computer program (the flash storage manager 45 or the like) stored in the main memory 102.

In other words, the processor 101 determines whether the write command needs to be transmitted or not (step S201) and, if the write command needs to be transmitted (YES in step S201), the processor 101 transmits to the flash storage device 3 the write command designating the user address of the data to be written, and the length of the data (step S202). The write command may designate the user address of the data to be written, a super block address indicative of one super block (one parallel unit), and the length of the data.

After that, if the processor 101 receives a response (including the user address, the flash address, and the length) of write operation completion from the flash storage device 3 (YES in step S203), the processor 101 updates LUT (step S204). Then, the processor 101 transmits the Trim command to designate the physical address corresponding to the previous data to the flash storage device 3, and instructs the flash storage device 3 to invalidate the previous data (or to decrement the reference count indicative of the number of the logical addresses referring to the previous data) (step S205).

A flowchart of FIG. 48 shows steps of the read operation executed by the host 2.

The processor 101 determines whether the read command needs to be transmitted or not (step S301) and, if the read command needs to be transmitted (YES in step S301), the processor 101 transmits the read command designating the flash address and the length to the flash storage device 3 (step S302).

After that, the processor 101 determines whether the read data has been received or not (step S303) and, if the read data has been received (YES in step S303), the operation is completed.

A flowchart of FIG. 49 shows steps of reference count increment/decrement processing executed by the host 2.

The processor 101 determines whether the duplication command to increase the reference count of the previous data needs to be transmitted or not (step S401) and, if the duplication command needs to be transmitted (YES in step S401), the processor 101 transmits the duplication command to the flash storage device 3 (step S402).

In addition, the processor 101 determines whether the Trim command to decrease the reference count of the previous data needs to be transmitted or not (step S403) and, if the Trim command needs to be transmitted (YES in step S403), the processor 101 transmits the Trim command to the flash storage device 3 (step S404).

As explained above, according to the embodiments, data write and read operations for the parallel unit (super block) can be normally executed without replacing the defective block in the parallel unit (super block) to be written with the other block included in the die to which this defective block belongs. Therefore, even if the number of defective blocks is increased, a large amount of replacement information does not need to be managed. In addition, since the address translation processing for replacement is also unnecessary, read latency can be reduced. Furthermore, since the same number of parallel units (super blocks) as the number of blocks belonging to each die can be basically constructed, almost all of the undefective blocks can be used even if the number of the defective blocks is increased. Accordingly, influence resulting from increase in the number of defective blocks can be reduced.

In addition, in the configuration in which the flash storage device 3 determines the write destination block and the write destination location in the write destination block and returns the physical address indicative of both of the write destination block and the write destination location to the host 2, merging the application-level address translation table of the upper layer (host 2) and the LUT-level address translation table of the conventional SSD can be implemented.

In the present embodiments, the NAND flash memory has been illustrated as a nonvolatile memory. However, the functions of the present embodiment are also applicable to various other nonvolatile memories such as a magnetoresistive random access memory (MRAM), a phase change random access memory (PRAM), a resistive random access memory (ReRAM) and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system connectable to a host, comprising:
a plurality of nonvolatile memory dies each including a plurality of blocks, each of the blocks being an erase unit; and
a controller electrically connected to the nonvolatile memory dies and configured to manage a plurality of parallel units each including blocks belonging to different nonvolatile memory dies, wherein
the controller is configured to:
manage defect information of at least 1-bit information indicative of being defective or undefective for each block in each parallel unit; and
receive from the host a write request designating a user address to identify first data to be written;
in response to receiving the write request, select one block from undefective blocks included in one parallel unit of the parallel units by referring to the defect information;
determine a write destination location in the selected block;
write the first data to the write destination location; and notify the host of a physical address indicative of both of the selected block and the write destination location, and the user address.

2. The memory system of claim 1, wherein the physical address includes a die identifier of the nonvolatile memory die to which the selected block belongs, a block address corresponding to the selected block, and an offset from a leading part of the selected block to the write destination location.

3. The memory system of claim 2, wherein the offset is represented by a page address of a page to which the write destination location belongs, and an in-page offset corresponding to the write destination location.

4. The memory system of claim 1, wherein the physical address includes a block address corresponding to the one parallel unit, and an offset from a leading part of the one parallel unit to the write destination location.

5. The memory system of claim 4, wherein the offset is represented by a die identifier of the nonvolatile memory die to which the selected block belongs, a page address of a page to which the write destination location belongs, and an in-page offset corresponding to the write destination location.

6. The memory system of claim 1, wherein the controller is further configured to:
receive from the host a read request to designate the physical address; and
in response to receiving the read request, read data from the write destination location in the selected block, based on the physical address.

7. The memory system of claim 1, wherein the controller is further configured to;
receive from the host a parallel unit allocate request to designate the number of blocks capable of parallel access;
in response to receiving the parallel unit allocate request, select a parallel unit including more number of undefective blocks than the number of designated blocks from the parallel units; and
allocate the selected parallel unit to the host, and
the one parallel unit is the selected parallel unit allocated to the host.

8. The memory system of claim 1, wherein the write request designates the user address, and a block address corresponding to one parallel unit, and the controller is further configured to:
select a parallel unit having the block address designated by the write request from the parallel units; and
select one block from undefective blocks included in the selected parallel unit as a block to which the first data are to be written, by referring to the defect information.

9. A method of controlling a plurality of nonvolatile memory dies each including a plurality of blocks, each of the blocks being an erase unit, the method comprising:
managing a plurality of parallel units each including blocks belonging to different nonvolatile memory dies;
managing defect information of at least 1-bit information indicative of being defective or undefective for each block in each parallel unit;
receiving from a host a write request designating a user address to identify first data to be written; and
executing, in response to receiving the write request, an operation of selecting one block from undefective blocks included in one parallel unit of the parallel units by referring to the defect information, an operation of determining a write destination location in the selected block, an operation of writing the first data to the write destination location, and an operation of notifying the host of a physical address indicative of both of the selected block and the write destination location, and the user address.

10. The method of claim 9, wherein the physical address includes a die identifier of the nonvolatile memory die to which the selected block belongs, a block address corresponding to the selected block, and an offset from a leading part of the selected block to the write destination location.

11. The method of claim 10, wherein the offset is represented by a page address of a page to which the write destination location belongs, and an in-page offset corresponding to the write destination location.

12. The method of claim 9, wherein the physical address includes a block address corresponding to the one parallel unit, and an offset from a leading part of the one parallel unit to the write destination location.

13. The method of claim 12, wherein the offset is represented by a die identifier of the nonvolatile memory die to which the selected block belongs, a page address of a page to which the write destination location belongs, and an in-page offset corresponding to the write destination location.

14. The method of claim 9, further comprising:
receiving from the host a read request to designate the physical address; and
in response to receiving the read request, reading data from the write destination location in the selected block, based on the physical address.

15. The method of claim 9, further comprising:
receiving from the host a parallel unit allocate request to designate the number of blocks capable of parallel access;
in response to receiving the parallel unit allocate request, selecting a parallel unit including more number of undefective blocks than the number of designated blocks from the parallel units; and
allocating the selected parallel unit to the host, wherein the one parallel unit is the selected parallel unit allocated to the host.

16. The method of claim 9, wherein the write request designates the user address, and a block address corresponding to one parallel unit, and the method further comprises:
selecting a parallel unit having the block address designated by the write request from the parallel units; and
selecting one block from undefective blocks included in the selected parallel unit as a block to which the first data are to be written, by referring to the defect information.

* * * * *